(12) United States Patent
Jung et al.

(10) Patent No.: US 10,825,830 B2
(45) Date of Patent: Nov. 3, 2020

(54) VERTICAL SEMICONDUCTOR DEVICES

(71) Applicant: SAMSUNG ELECTRONICS CO., LTD., Suwon-si (KR)

(72) Inventors: Tae-Chul Jung, Hwaseong-si (KR); Bong-Tae Park, Seoul (KR); Jae-Joo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 16/392,958

(22) Filed: Apr. 24, 2019

(65) Prior Publication Data

US 2020/0105785 A1    Apr. 2, 2020

(30) Foreign Application Priority Data

Sep. 28, 2018 (KR) .......................... 10-2018-0115730

(51) Int. Cl.
| | |
|---|---|
| *H01L 23/528* | (2006.01) |
| *H01L 27/11565* | (2017.01) |
| *H01L 27/11582* | (2017.01) |
| *H01L 21/768* | (2006.01) |

(52) U.S. Cl.
CPC .. *H01L 27/11582* (2013.01); *H01L 21/76897* (2013.01); *H01L 23/5283* (2013.01); *H01L 27/11565* (2013.01)

(58) Field of Classification Search
CPC ........... H01L 21/76897; H01L 23/5283; H01L 27/11565; H01L 27/11582
USPC ....................................................... 257/324
See application file for complete search history.

(56) References Cited

U.S. PATENT DOCUMENTS

| | | | |
|---|---|---|---|
| 8,724,418 B2 | 5/2014 | Kim et al. | |
| 9,281,344 B2 | 3/2016 | Lee et al. | |
| 9,431,416 B2 | 8/2016 | Nam et al. | |
| 9,985,048 B2 | 5/2018 | Lee | |
| 2010/0090286 A1* | 4/2010 | Lee ........................ | H01L 29/792 257/368 |
| 2017/0077136 A1* | 3/2017 | Kim .................. | H01L 29/40117 |

(Continued)

FOREIGN PATENT DOCUMENTS

| | | |
|---|---|---|
| KR | 10-2009-0041895 | 4/2009 |
| KR | 10-0956985 | 5/2010 |

(Continued)

*Primary Examiner* — Long K Tran
(74) *Attorney, Agent, or Firm* — F. Chau & Associates, LLC

(57) ABSTRACT

A vertical semiconductor device includes a substrate with a first and second region. A conductive pattern on the first region extends in a first direction. The first region includes a cell region, a first dummy region and a second dummy region. The conductive pattern extends in a first direction. A pad is disposed on the second region, the pad contacts a side of the conductive pattern. A plurality of first dummy structures extends through the conductive pattern on the first dummy region. A plurality of second dummy structures extend through the conductive pattern on the second dummy region, the second dummy structures disposed in a plurality of columns that extend in a second direction perpendicular to the first direction. Widths of upper surfaces of the second dummy structures are different in each column, and the widths of upper surfaces of the second dummy structures increase toward the second region.

20 Claims, 23 Drawing Sheets

(56) References Cited

U.S. PATENT DOCUMENTS

2018/0040553 A1    2/2018  Tak et al.
2018/0166380 A1*   6/2018  Park ................. H01L 27/11575
2018/0247953 A1    8/2018  Lee

FOREIGN PATENT DOCUMENTS

| KR | 10-1847541     | 4/2015  |
|----|----------------|---------|
| KR | 10-2015-0091944 | 8/2015  |
| KR | 10-2017-0131945 | 12/2017 |
| KR | 10-2018-0014911 | 2/2018  |

* cited by examiner

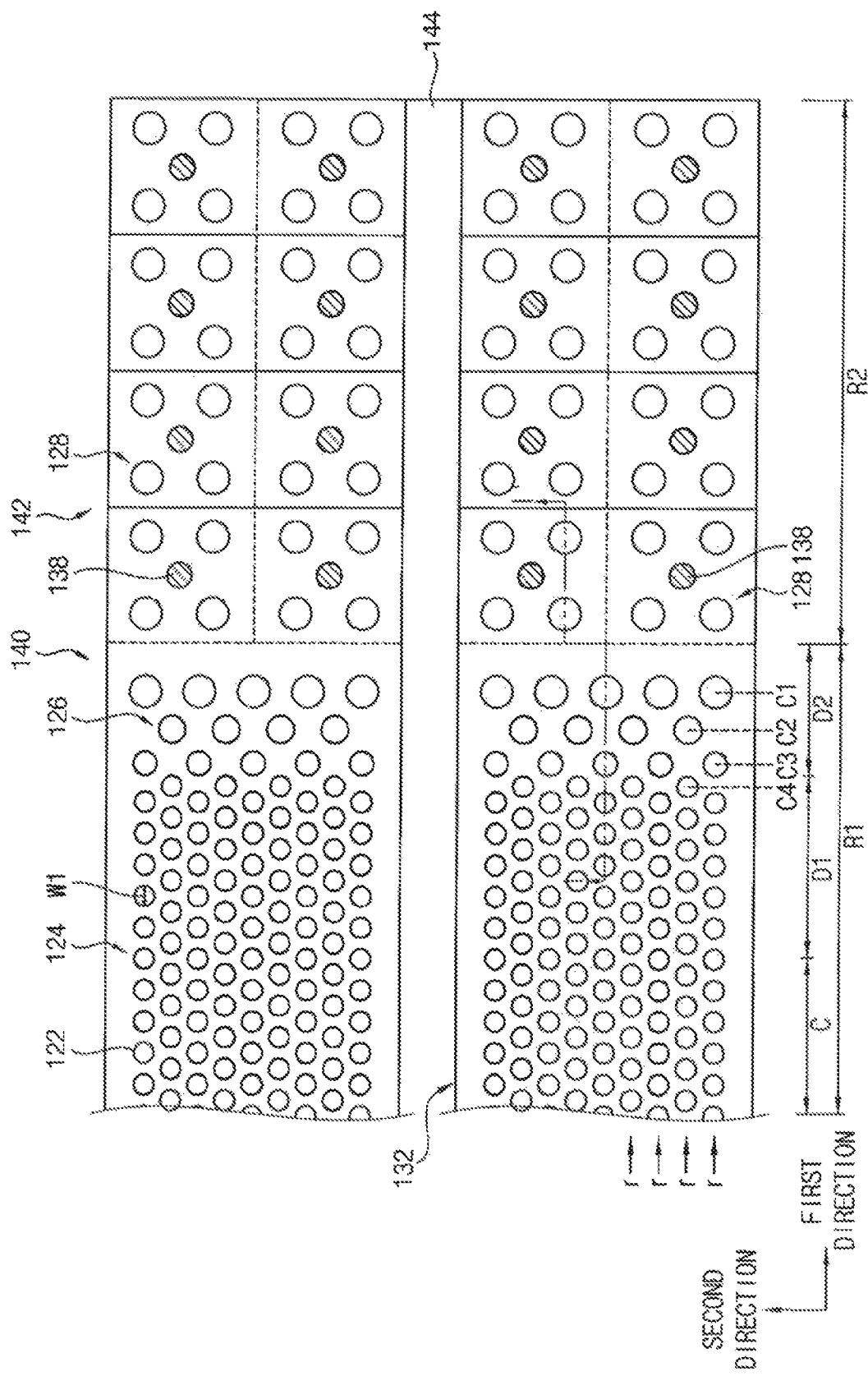

VERTICAL SEMICONDUCTOR DEVICES

CROSS-REFERENCE TO RELATED APPLICATION

This application claims priority under 35 U.S.C. § 119 to Korean Patent Application No. 10-2018-0115730, filed on Sep. 28, 2018, in the Korean intellectual Property Office (KIPO), the disclosure of which is incorporated by reference herein in its entirety.

TECHNICAL FIELD

Exemplary embodiments of the present inventive concept relate to a vertical semiconductor device. More particularly, exemplary embodiments of the present inventive concept relate to vertical semiconductor device including a dummy structure.

DISCUSSION OF RELATED ART

A vertical semiconductor device including a plurality of memory cells vertically stacked on a substrate has been developed. In the vertical semiconductor device, the number of stacked memory cells and an arrangement density of the memory cells may be increased. Thus, to form normal memory cells that electrically operate, dummy structures that do not electrically operate are also formed.

SUMMARY

According to an exemplary embodiment of the present inventive concept, there may be provided a vertical semiconductor device. The vertical semiconductor device may include a substrate with a first region and a second region. A conductive pattern structure may be disposed on the first region and extending in a first direction. The first region includes a cell region, a first dummy region and a second dummy region. The conductive pattern structure extends in the first direction. A pad structure may be disposed on the second region, the pad structure may contact a side of the conductive pattern structure. A plurality of first dummy structures may extend through the conductive pattern structure on the first dummy region adjacent to the cell region. A plurality of second dummy structures may extend through the conductive pattern structure on the second dummy region adjacent to the second region, the second dummy structures disposed in a plurality of columns that extend in a second direction perpendicular to the first direction. Widths of upper surfaces of the second dummy structures may be different from each other in each of the columns, and the widths of upper surfaces of the second dummy structures gradually increase toward the second region.

According to an exemplary embodiment of the present inventive concept, there may be provided a vertical semiconductor device including a substrate with a first region and second region. A conductive pattern structure may be disposed on the first region and extending in a first direction. The first region may include a cell region, a first dummy region adjacent to the cell region and a second dummy region adjacent to the second region. A pad structure may be disposed on the second region adjacent to the first region. The pad structure may contact a side of the conductive pattern structure. A plurality of first dummy structures may extend through the conductive pattern structure on the first dummy region adjacent to the cell region. A plurality of second dummy structures may extend through the conductive pattern structure on the second dummy region adjacent to the second region. The second dummy structures may be disposed in a plurality of columns extending in a second direction perpendicular to the first direction. A width of an upper surface of each of the second dummy structures may be greater than a width of an upper surface of each of the first dummy structures, and a first spacing in the first direction between central portions of neighboring second dummy structures is greater than a second spacing in the first direction between central portions of neighboring first dummy structures.

According to an exemplary embodiment of the present inventive concept, there may be provided a vertical semiconductor device including a conductive pattern structure disposed on a first region, wherein the first region includes a cell region, a first dummy region and a second dummy region on a substrate. The conductive pattern structure may extend in a first direction. A pad structure may be disposed on a second region adjacent to the first region, the pad structure may contact a side of the conductive pattern structure. A plurality of first dummy structures may extend through the conductive pattern structure on the first dummy region adjacent to the cell region, and a plurality of second dummy structures may extend through the conductive pattern structure on the second dummy region adjacent to the second region. The second dummy structures may be disposed in a plurality of columns in a second direction perpendicular to the first direction. An upper surface area of at least one second dummy structure may be greater than an upper surface area of at least one first dummy structure. An area of an upper surface of the second dummy structure in a first column may be different from an area of an upper surface of the second dummy structure in a second column.

BRIEF DESCRIPTION OF THE DRAWINGS

Exemplary embodiments of the present inventive concept will be more clearly understood from the following detailed description taken in conjunction with the accompanying drawings in which:

FIGS. 13, 14, 15, 16, 17, 18, 19, 20, 21, 22 and 23 are cross-sectional views and plan views illustrating stages of a method of manufacturing a vertical semiconductor device in accordance with exemplary embodiments of the present inventive concept.

DETAILED DESCRIPTION OF THE EMBODIMENTS

Figure 1:
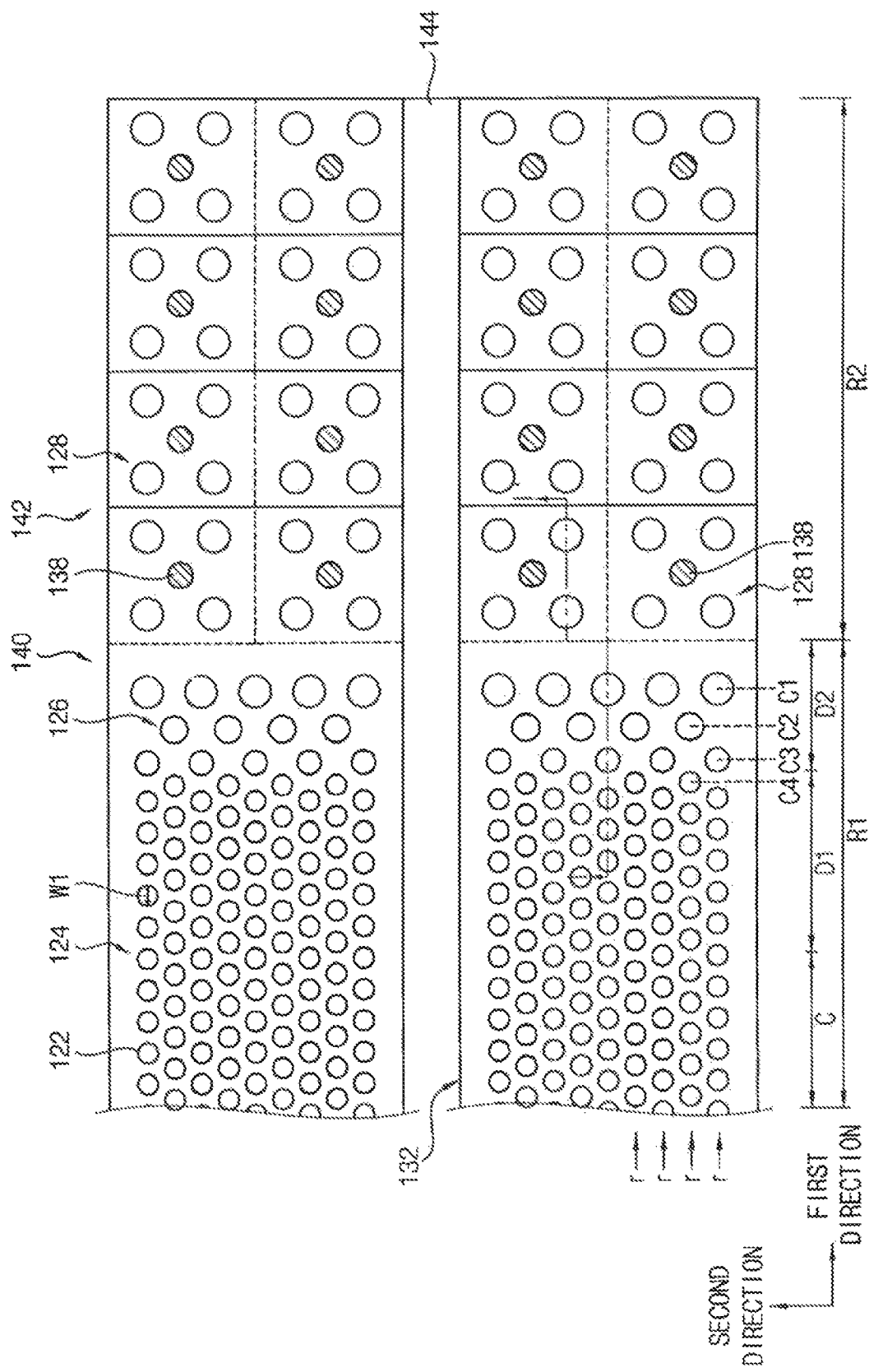
FIG. 1 is a plan view illustrating a vertical semiconductor device in accordance with an exemplary embodiment of the present inventive concept.
Figure 2:
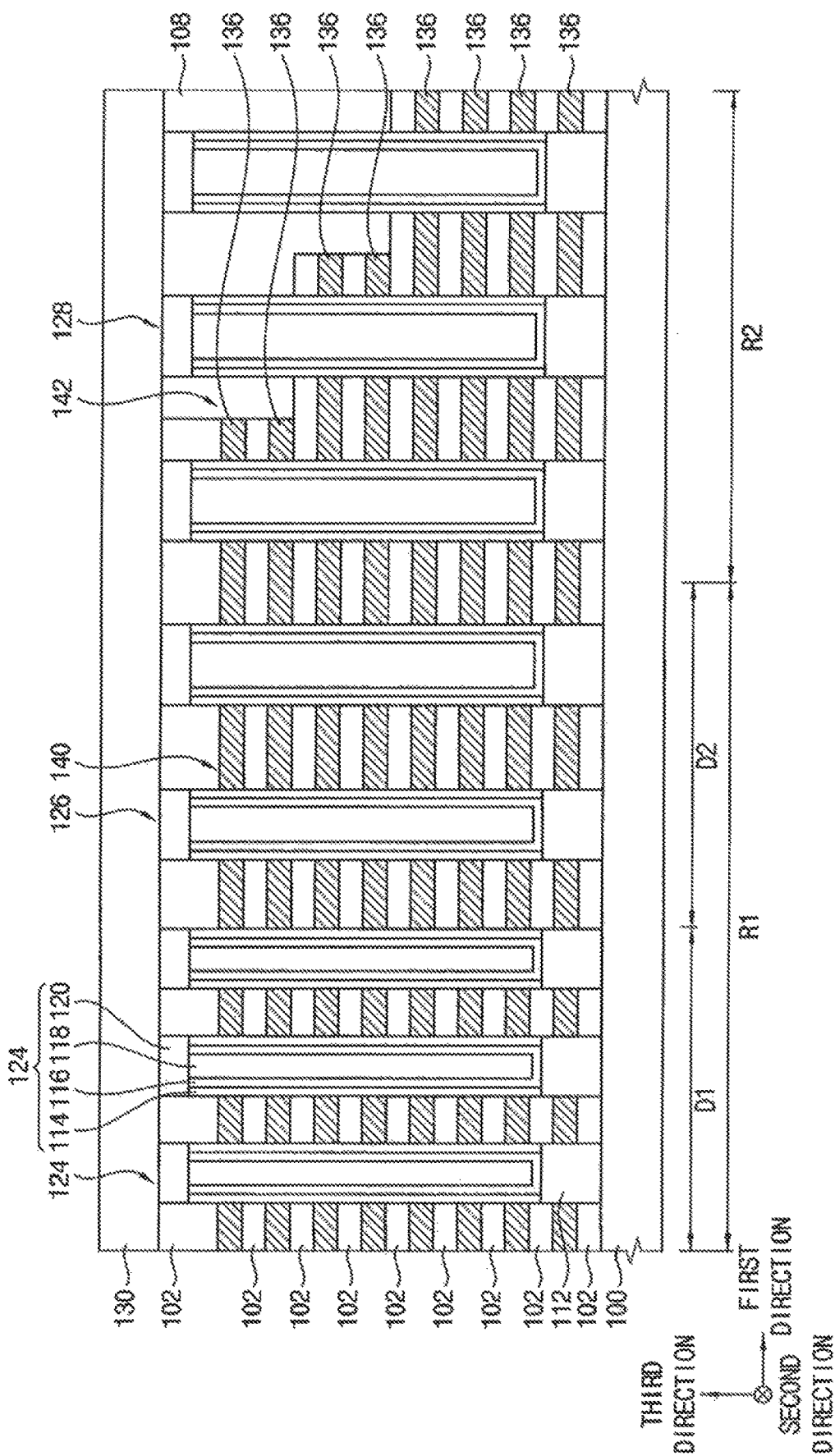
FIGS. 2 and 3 are a cross-sectional view and an enlarged plan view, respectively, illustrating a portion of a vertical semiconductor device in accordance with exemplary embodiments of the present inventive concept.
Figure 3:
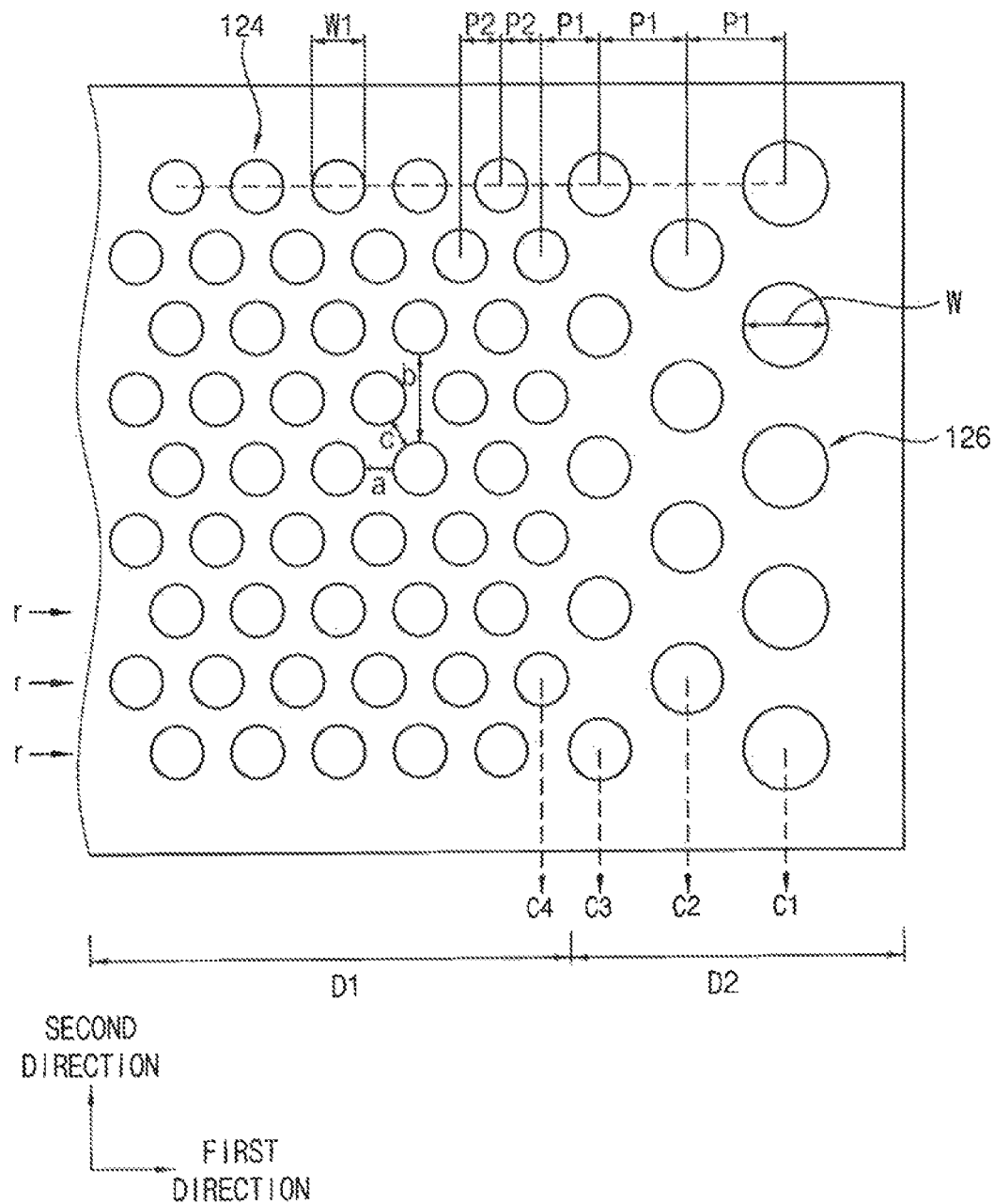

FIG. 1 is a plan view illustrating a vertical semiconductor device in accordance with an exemplary embodiment of the present inventive concept. FIGS. 2 and 3 are a cross-sectional view and an enlarged plan view, respectively, illustrating a portion of a vertical semiconductor device in according to an exemplary embodiment of the present inventive concept.

FIG. 2 illustrates a first dummy region, a second dummy region and a second region, and FIG. 2 is cross-sectional view taken along line I-I' of FIG. 1, and FIG. 3 illustrates a first dummy region and a second dummy region, according to respective exemplary embodiments of the present inventive concept.

Referring to FIGS. 1, 2 and 3, a substrate 100 may include a first region R1 and a second region R2. The first region R1 may include a cell region C, a first dummy region D1 and a second dummy region D2. The second region R2 may be a wiring region including wiring structures.

The cell region C may be a region on which memory cells may be formed that actually operate, and the first and second dummy regions D1 and D2 may be regions on which dummy cells that do not actually operate are formed. The first dummy region D1 may be adjacent to the cell region C. The second dummy region D2 may be disposed between the first dummy region D1 and the second region R2. In other words, the second dummy region D2 may be adjacent to the second region R2.

A conductive pattern structure 140 may be formed on the first region R1, and a channel structure 122 and first and second dummy structures 124 and 126 may be formed through the conductive pattern structure 140. A channel structure 122 may be formed on the cell region C. A first dummy structure 124 may be formed on the first dummy region D1, and a second dummy structure 126 may be formed on the second dummy region D2.

A pad structure 142 and a first upper insulating interlayer 108 covering the pad structure 142 may be formed on the second region R2. A third dummy structure 128 may extend through the first upper insulating interlayer 108 and the pad structure 142. In addition, a contact plug 138 may contact an upper surface of the pad structure 142. The pad structure 142 may extend in a first direction to contact an end portion in the first direction of the conductive pattern structure 140. Thus, the pad structure 142 and the conductive pattern structure 140 may be merged to have one body. For example, the pad structure 142 and the conductive pattern structure 140 may be connected to one another or integrally formed.

The conductive pattern structure 140 and the pad structure 142 may serve as a stacked structure extending in the first direction parallel to an upper surface of the substrate 100. In addition, a plurality of stacked structures may be spaced apart from each other in a second direction parallel to the upper surface of the substrate 100 and perpendicular to the first direction. An insulation pattern 144 may fill openings 132 between the stacked structures.

The substrate 100 may include a semiconductor material, e.g., silicon, germanium, and/or silicon-germanium.

The stacked structure may include insulation layers 102 and conductive patterns 136 alternately and repeatedly stacked. In other words, the conductive patterns 136 may be spaced apart from each other in a third direction substantially perpendicular to the upper surface of the substrate 100. The conductive pattern 136 included in the stacked structure may include a metal material. According to an exemplary embodiment of the present inventive concept, the conductive pattern 136 may include a metal pattern and a barrier metal pattern. The metal pattern may include, e.g., tungsten, copper, cobalt, aluminum, etc., and the barrier metal pattern may include, e.g., titanium, titanium nitride, tantalum, tantalum nitride, etc.

The conductive patterns 136 included in the conductive pattern structure 140 may include a ground selection line (GSL), a string selection line (SSL), and a plurality of word lines between the GSL and SSL. In other words, a ground selection transistor may be formed at a lowermost portion of the conductive pattern structure 140, and a string selection transistor may be formed at an uppermost portion of the conductive pattern structure.

The pad structure 142 may have a step shape. Upper surfaces of edges of the conductive patterns 136 may have a step shape, so that each step may have a different plane. For example, the stacked structures that include both the insulation layers 102 and the conductive patterns 136 (alternately stacked) may have descending heights in a third direction as they are spaced further apart from the first region R1 in the first direction. According to an exemplary embodiment of the present inventive concept, an upper portion of each stacked structure nearest a second upper insulating layer 130 may include a narrower width in the first direction than the width of a lower portion of the stacked structure beneath it. The upper surfaces of the conductive patterns 136 may serve as a pad for contacting the contact plug 138.

According to exemplary embodiments of the present inventive concept, the pad structure 142 may include step portions in each of the first and second directions. For example, the pad structure 142 may include a plurality of steps disposed at a plurality of different heights in the first direction, respectively, along the first direction, and a plurality of steps disposed at a plurality of sub-levels, respectively, in each level in the second direction. For example, the pad structure 142 may include two steps in a second direction. However, a shape of the steps of the pad structure 142 is not limited thereto.

The second upper insulating interlayer 130 may be formed on the first upper insulating interlayer 108 and the conductive pattern structure 140. The upper surface of the second upper insulating interlayer 130 may be substantially flat.

The channel structure 122 and the first and second dummy structures 124 and 126 may have a pillar shape extending through the conductive pattern structure 140. The third dummy structure 128 may have a pillar shape extending through the first upper insulating interlayer 108 and the pad structure 142.

The channel structures 122 may be formed to fill a channel hole, and the first to third dummy structures 124, 126, and 128 may be formed to fill first, second and third dummy holes, respectively.

According to exemplary embodiments of the present inventive concept, semiconductor patterns 112 may be further formed on bottoms of the channel hole and the first, second and third dummy holes, respectively. In other words, the channel structure 122, and the first, second and third dummy structures 124, 126, and 128 may be formed on the semiconductor pattern 112. The semiconductor pattern 112 may include, e.g., single crystal silicon and/or polysilicon. According to exemplary embodiments of the present inventive concept, the channel structure 122, and the first, second and third dummy structures 124, 126, and 128 may directly contact the substrate 100.

According to exemplary embodiments of the present inventive concept, the semiconductor pattern 112 may serve as a channel region of the ground selection transistor formed at the lowermost portion of the conductive pattern structure, in the vertical semiconductor device. Thus, the semiconductor pattern 112 may be disposed on a gate of the ground selection transistor. An upper surface of the semiconductor pattern 112 may be disposed on the insulation layer 102 between two lowermost conductive patterns 136. For example, side surfaces of insulation layers 102 may face one another while forming opposite sides of a channel hole or dummy hole, and side surfaces of the semiconductor pattern 112 formed inside the channel hole or the dummy hole may contact the side surfaces of the insulation layers 102 that face one another.

According to exemplary embodiments of the present inventive concept, the channel structure 122 and the first, second and third dummy structures 124, 126, and 128 may have the same stacked structure. According to an exemplary embodiment of the present inventive concept, the channel structure 122 and the first, second and third dummy structures 124, 126 and 128 may include a dielectric structure 114, a channel 116, a filling insulation pattern 118, and an upper conductive pattern 120.

Hereinafter, an arrangement or a layout of the channel structure 122 and the first, second and third dummy structures 124, 126, and 128 are described with reference to the plan view.

The first dummy structure 124 is not operated as an actual memory cell, and the channel structure 122 may be operated as an actual memory cell. The channel structure 122 and the first dummy structure 124 may be distinguished from one another according to whether it operates as an actual memory cell or not. However, the channel structure 122 may have an arrangement, a shape, and a stacked structure substantially the same as those of the first dummy structure 124. Thus, although the channel structure 122 is not shown in FIGS. 2 and 3, a cross-sectional view and a plan view of the channel structure 122 may be substantially the same as those shown of the first dummy structure 124.

A plurality of channel structures 122 and first dummy structures 124 may be arranged throughout the first region R1. For example the plurality of channel structures 122 and first dummy structures 124 may each be spaced at regular intervals.

According to exemplary embodiments of the present inventive concept, each of the channel structures 122, the first dummy structures 124, and the second dummy structures 126 may be arranged in columns extending in the second direction. According to exemplary embodiments of the present inventive concept, the first dummy structures 124 of an odd-numbered column and an even-numbered column may be disposed in a zig-zag fashion in the first direction. For example, the arrangement of a first dummy structure 124 belonging to an even-numbered column with respect to an adjacent first dummy structure 124 belonging to an odd-numbered column is staggered when viewed from a plan view. The second dummy structures 126 of the odd-numbered column and the even-numbered column may also be disposed in a zig-zag fashion in the first direction. According to exemplary embodiments of the present inventive concept, central portions of the first and second dummy structures 124 and 126 of the odd-numbered column may be disposed in a straight line extending in the first direction. In addition, central portions of the first and second dummy structures 124 and 126 of the even-numbered column may be disposed in a straight line extending in the first direction.

According to exemplary embodiments of the present inventive concept, in each row r extending in the first direction, the central portions of the channel structure 122 and the first and second dummy structures 124 and 126 may be aligned in a straight line extending in the first direction. Thus, the second dummy structures 126 disposed in the same column may be spaced apart from each other to have the same spacing in the second direction.

Upper surfaces of the channel structures 122 and the first dummy structures 124 may have the same width in each of the first and second directions. Each of the upper surfaces of the channel structures 122 and the first dummy structures 124 may have a first width W1. Thus, each of the upper surfaces of the channel structures 122 and the first dummy structures 124 may have a substantially circular shape.

A spacing in the first direction between neighboring channel structures 122 and a spacing in the first direction between neighboring first dummy structures 124 may be substantially the same to each other, and the spacing may be referred to as a first X-spacing a. For example, the first X-spacing a may refer to the space between adjacent channel structures 122 or adjacent first dummy structures 124 disposed in a same row r. A spacing in the second direction between the neighboring channel structures 122 and a spacing in the second direction between the neighboring first dummy structures 124 may be substantially the same to each other, and the spacing may be referred to as a first Y-spacing b. For example, the first Y-spacing b may refer to the space between adjacent channel structures 122 or adjacent first dummy structures 124 disposed in a same column as one another. A spacing in a diagonal direction between the neighboring channel structures 122 and a spacing in a diagonal direction between the neighboring first dummy structures 124 may be substantially the same to each other, and the spacing may be referred to as a first distance c. For example, the first distance c may refer to a space between a pair of adjacent channel structures 122 or a space between a pair of first dummy structures 124 disposed in consecutive columns.

According to exemplary embodiments of the present inventive concept, the first Y-spacing b may be greater than each of the first X-spacing a and the first distance c. In example embodiments of the present inventive concept, the first distance c may be less than each of the first X-spacing a and the first Y-spacing b. However, the first X-spacing a, the first Y-spacing b, and the first distance c may be changed by the arrangement of the channel structure 122 and the first dummy structures 124, so that the first X-spacing a, the first Y-spacing b, and the first distance c may not be limited thereto.

A plurality of second dummy structures 126 may be regularly arranged similar to arrangements of the channel structures 122 and the first dummy structures 124. The second dummy structures 126 may be disposed adjacent to the second region R2 in the first direction, and the second dummy structures 126 may be arranged in the first direction.

The second dummy structures 126 may be disposed in a plurality of columns from a last column C1 in the first direction in the first region R1. For example, shown in FIGS. 1 and 3, the second dummy structures 126 may be disposed in a first column C1, which is the last column in the first direction in the first region R1, a second column C2 and a third column C3, which are two columns adjacent to the first column C1 in the first direction. Hereinafter, the second dummy structures 126 may be disposed in the first, second and third columns C1, C2, C3. The first dummy structures 124 may be disposed in the fourth column C4. However, the second dummy structures 126 may be disposed at two columns or four or more columns.

Arrangements and/or shapes of the second dummy structures 126 may be different from those of the channel structures 122 and the first dummy structures 124. In the plan view, a shape of an upper surface of the second dummy structure 126 may be different from shapes of the upper surfaces of the channel structure 122 and the first dummy structure 124.

According to exemplary embodiments of the present inventive concept as shown in FIG. 3, the upper surface of the second dummy structure 126 may have a substantially circular shape. A width W of the upper surface of the second dummy structure 126 may be greater than the first width W1 of the upper surface of the first dummy structure 124. Thus, the upper surface of the second dummy structure 126 may be greater than the upper surface of the first dummy structure 124. In addition, the widths W of the upper surfaces of the second dummy structures 126 disposed at the same column may be equal to each other.

According to exemplary embodiments of the present inventive concept, the upper surfaces of the second dummy structures 126 disposed in each column may have different widths to each other. Particularly, the second dummy structures 126 of the first column C1 may have a widest width, and the widths of the second dummy structures 126 may be gradually decreased from the first column C1 toward the third column C3. Thus, the upper surfaces of the second dummy structures 126 may have different areas according to each column.

In exemplary embodiments of the present inventive concept, the upper surface of the second dummy structures 126 of the first column C1 may have a width of about 105% to about 150% of the first width W1. For example, the upper surface of the second dummy structures 126 of the first column C1 may have a width of about 110% to about 130% of the first width W1.

The first, second and third dummy structures 124, 126, and 128 and the channel structure 122 may be formed by the same process. When the width of the second dummy structure 126 is greater than about 150% of the first width W1, stacked shapes of layers included in the second dummy structure 126 may be greatly different from those of the channel structure 122 and the first dummy structure 124. According to exemplary embodiments of the present inventive concept, a spacing in the first direction between central portions of neighboring second dummy structures 126 and a spacing in the first direction between the central portions of neighboring second dummy structures 126 may be referred to as a first spacing P1. The first spacing P1 may be greater than a second spacing P2, which is a spacing in a first direction between central portions of neighboring first dummy structures 124.

According to exemplary embodiments of the present inventive concept, the first spacings P1 may be different to each other according to positions in the second dummy region D2. For example, the first spacing P1 adjacent to the second region R2 may be widest. The first spacings P1 may be gradually decreased toward the first dummy region D1.

According to exemplary embodiments of the present inventive concept, the spacing in the second direction between second dummy structures 126 disposed in the same column may be less than the first Y-spacing b. According to exemplary embodiments of the present inventive concept, spacing in the second direction of the second dummy structures 126 of the first column C1 may be narrowest, and the spacing in the second direction may be increased toward the first dummy region D1. For example the spacing in the second direction between adjacent second dummy structures 126 within a same column may be increased in columns from the first column C1 towards the fourth column C4.

A plurality of the third dummy structures 128 may be formed in the second region R2. An arrangement density of the third dummy structures 128 may be lower than the arrangement density of each of the channel structures 122 and/or the first and second dummy structures 124 and 126.

For example, a spacing between the third dummy structures 128 may be greater than the spacing between each of the channel structures 122, the spacing between the first dummy structures 124, or the spacing between the second dummy structures 126.

The third dummy structure 128 may have an upper surface including various widths and shapes and is not limited to the exemplary embodiments shown in the figures. According to exemplary embodiment of the present inventive concept, the width of the upper surface of the third dummy structure 128 may be substantially the same as or greater than the width of the upper surface of the first dummy structure 124. In addition, the shape of the upper surface of the third dummy structure 128 may be substantially the same as or different from the shape of the upper surface of the first dummy structure 124.

The first and second dummy structures 124 and 126 may support the conductive pattern structure 140. The third dummy structures 128 may support the pad structure 142.

The channel structures 122 serving as actual operated memory cells and the first and second dummy structures 124 and 126 may share the conductive pattern structure 140. Thus, when defects occur to the first and second dummy structures 124 and 126, electrical failure of the actual memory cells may also be generated via the shared conductive pattern structure 140.

The second dummy structures 126 may be adjacent to the third dummy structure 128 and have a lower arrangement density. Thus, when the second dummy structures 126 and the first dummy structures 124 are formed by the same process, defects of the second dummy structures 126 may be generated. For example, when first and second dummy holes for forming the first and second dummy structures 124 and 126 are formed by the same photolithography process using a reticle of the same size, the second dummy holes may have a width less than a width of the first dummy hole. In addition, the second dummy hole may not expose a surface of the substrate, which is referred to as a not open failure. Particularly, an etching loading may be generated at a portion adjacent to the second region R2, so that the second dummy holes of the first column C1 may be formed to have a small width. As distance from the second region R2 increases, the widths of the second dummy holes may be gradually increased to have a similar width to the first dummy holes. In other words, the not open failure of second dummy holes may increase closer to the second region R2. Accordingly, the second dummy structure 126 formed in the second dummy hole may not support the conductive pattern structure 140, and leakage of currents in the semiconductor device may occur due to a process failure.

According to exemplary embodiments of the inventive concept, the width of the upper surface of the second dummy structure 126 may be greater than the width of the upper surface of the first dummy structure 124. Thus, the not open failure of the second dummy hole may be reduced in a process for forming the second dummy structure 126. Therefore, defects of the second dummy structure 126 may decrease.

On the other hand, when the width of the second dummy structure 126 is increased, a contacting defect between the second dummy structures 126 may occur. However, in exemplary embodiments of the present inventive concept, the first spacing P1 may be greater than the second spacing P2. In addition, the first spacing P1 adjacent to the second region R2 may be widest, and the first spacing P1 may be gradually decrease toward the first dummy region D1. Thus, by adjusting the first spacing P1 between the second dummy structures 126 and the first spacing P1 between the first and second dummy structures 124 and 126, the contacting defect between the second dummy structures 126 may be decreased.

A minimum spacing between the second dummy structures 126 may be equal to or greater than the minimum spacing between first dummy structures 124. For example, when the first distance c in a diagonal direction between the first dummy structures 124 is the narrowest, the minimum spacing between the second dummy structures 126 may be equal to or greater than the first distance c. In other words, the spacing between second dummy structures 126 may not be narrower than the first distance c.

A contact plug 138 may contact an upper surface of each conductive pattern 136 of the pad structure 142 extending through the first and second upper insulating interlayers 108 and 130. A plurality of contact plugs 138 may be formed on pads of the pad structure 142, respectively. According to exemplary embodiments of the present inventive concept, the contact plug 138 may include a barrier metal pattern and/or a metal pattern. A wiring line may further be formed on the upper surface of the contact plug 138.

The arrangement and the shape of the second dummy structure 126 in the second dummy region D2 may be variously changed. Hereinafter, referring to FIGS. 4 to 12, exemplary embodiments of the present inventive concept are described in which the arrangement and/or the shape of the second dummy structure is modified. In FIGS. 4 to 12, only the first and second dummy structures in the first and second dummy regions are illustrated.

Figure 4:
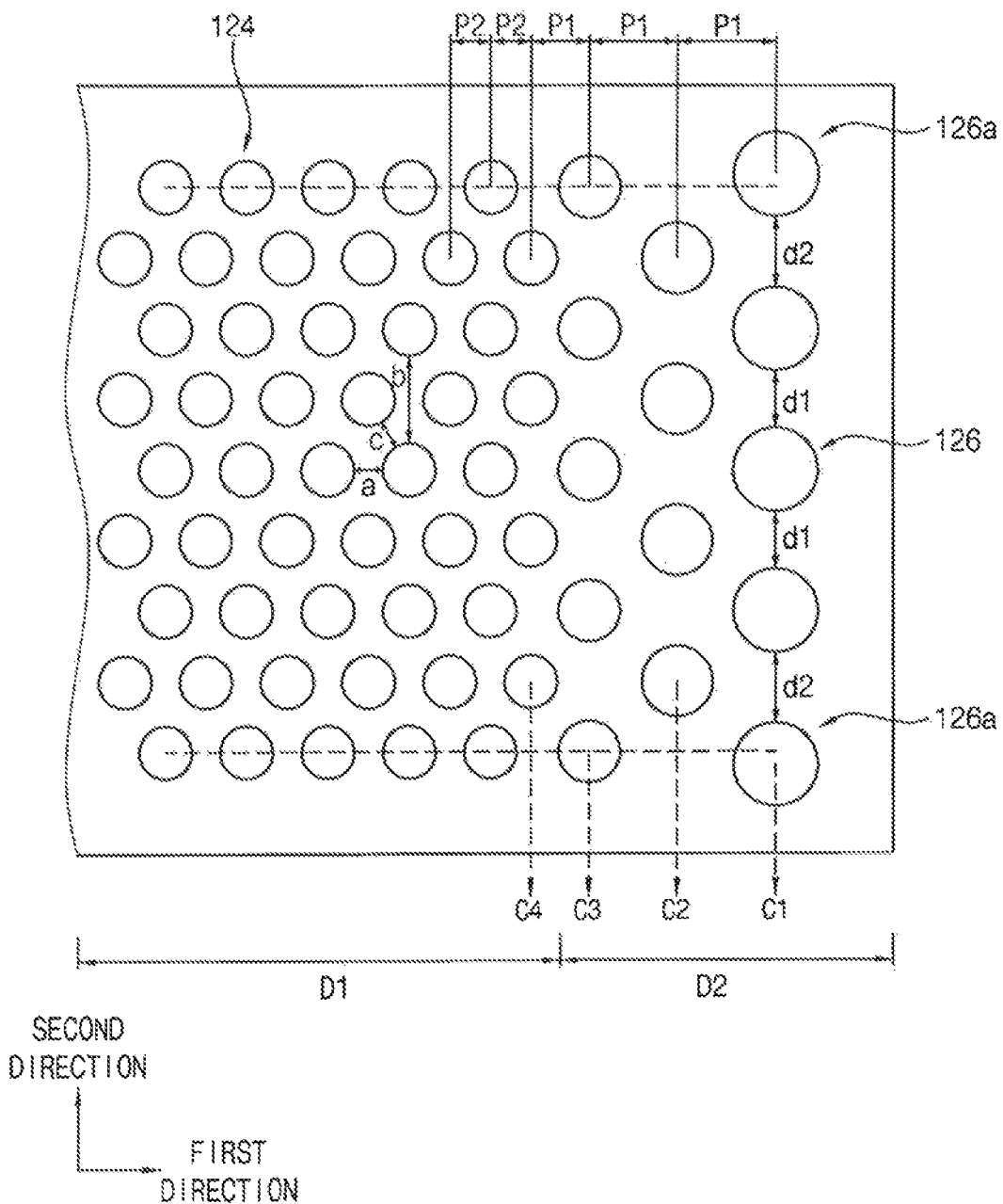
FIGS. 4, 5, 6, 7, 8, 9, 10, 11 and 12 are plan views illustrating a portion of a vertical semiconductor device in accordance with exemplary embodiments of the present inventive concept.

FIG. 4 is a plan view illustrating a portion of a vertical semiconductor device in accordance with exemplary embodiments of the present inventive concept.

The vertical semiconductor device according to an exemplary embodiment of the present inventive concept may be substantially the same as the vertical semiconductor device illustrated with reference to FIGS. 1 to 3 according to an exemplary embodiment of the present inventive concept, except for an arrangement of some of the second dummy structures.

Referring to FIG. 4, the second dummy structure 126 may have a shape substantially the same as that of the second dummy structure described with reference to FIGS. 1 to 3, except for a shape of an edge second dummy structure 126a. The edge second dummy structure 126a may be disposed at an edge portion in the second direction of the conductive pattern structure 140, and may be disposed in the first column C1. For example, edge second dummy structures 126a may be outermost second dummy structures 126.

A central portion of the edge second dummy structure 126a may not be disposed in a same straight line as the central portions of the first dummy structures 124 disposed at an edge of the conductive pattern structure 140 in the second direction. The central portion of the edge second dummy structure 126a may be disposed to be closer to the edge of the conductive pattern structure 140 in the second direction. In other words, the distance d2 between the edge second dummy structure 126a and the second dummy structure 126 adjacent to the edge second dummy structure 126a in the second direction may be greater than the distance d1 between other second dummy structures 126 of first column C1. In addition, a spacing between the edge second dummy structure 126a and the second dummy structure 126 adjacent to the edge second dummy structure 126a in the diagonal direction may be greater than or the same as the first distance c.

The edge second dummy structure 126a may have a difference of an arrangement density in each of the first direction and the second direction, so that a pattern loading of the edge second dummy structure 126a may be greater than that of the other second dummy structures 126. As the spacing between the edge second dummy structure 126a and the second dummy structure 126 adjacent to the edge second dummy structure 126a increases, defects of the edge second dummy structure 126a may be reduced.

According to exemplary embodiments of the present inventive concept, a width of an upper surface of the edge second dummy structure 126a may be substantially the same as a width of an upper surface of the second dummy structure 126 adjacent to the edge second dummy structure 126a in the second direction. According to an exemplary embodiment of the present inventive concept, a width of an upper surface of the edge second dummy structure 126a may be greater than a width of an upper surface of the second dummy structure 126 adjacent to the edge second dummy structure 126a in the second direction.

Figure 5:
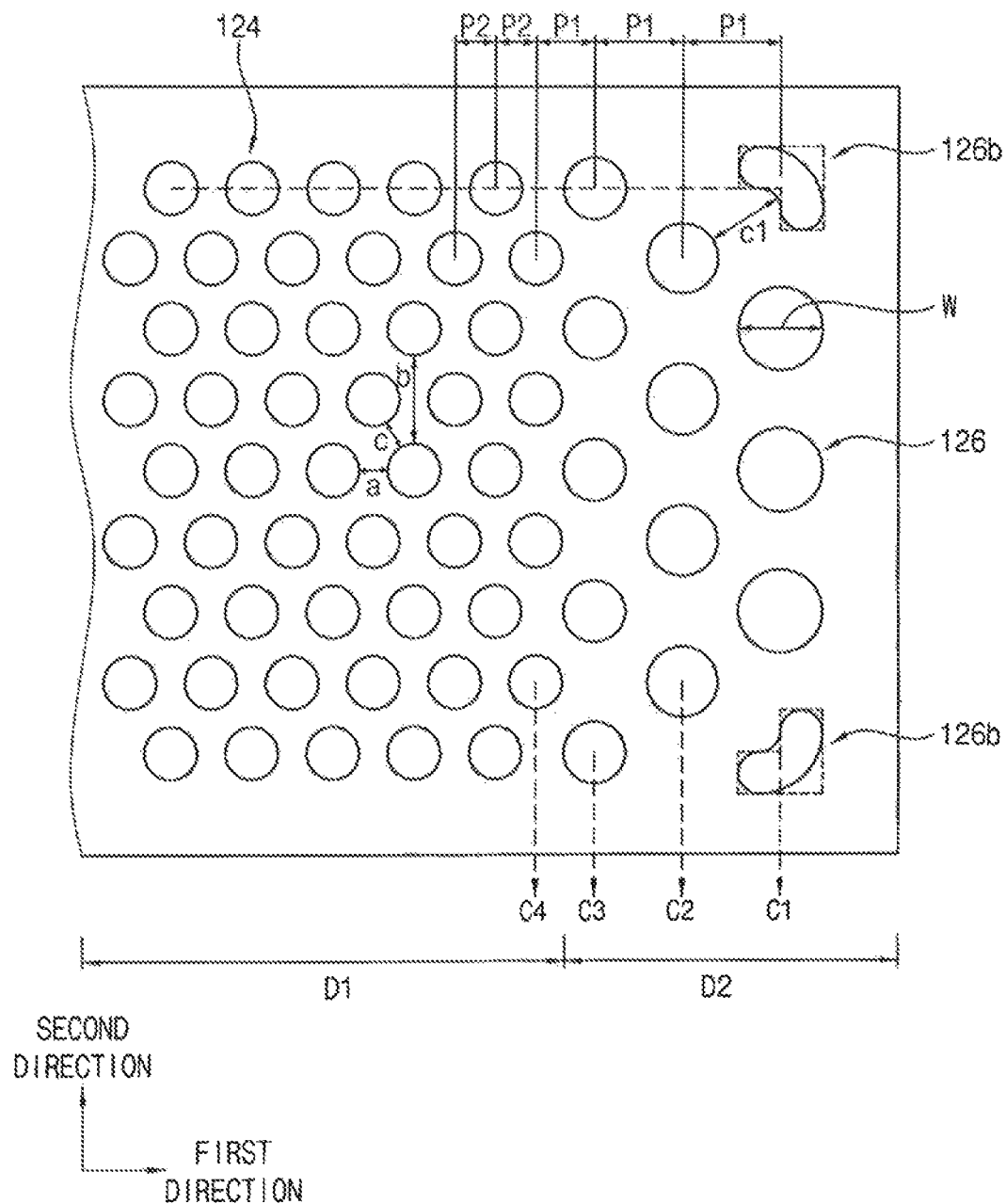

FIG. 5 is a plan view illustrating a portion of a vertical semiconductor device in accordance with an exemplary embodiment of the present inventive concept.

The vertical semiconductor device may be substantially the same as the vertical semiconductor device described with reference to FIGS. 1 to 3, except for a shape of some of the second dummy structures.

Referring to FIG. 5, the second dummy structure 126 may have a shape substantially the same as the shape of the second dummy structure described with reference to FIGS. 1 to 3, except for a shape of an edge second dummy structure 126b. The edge second dummy structure 126b may be disposed at an edge portion in the second direction of the conductive pattern structure 140, and may be disposed in the first column C1. For example, the edge second dummy structures 126b may be disposed as outermost second dummy structures 126.

According to exemplary embodiments of the present inventive concept, a shape of an upper surface of the edge second dummy structure 126b may be different from that of the upper surface of the second dummy structure 126 adjacent to the edge second dummy structure 126b in the second direction. The upper surface of the edge second dummy structure 126b may have an irregular shape including a concave portion in an oblique direction with respect to the first or second directions, so that a spacing between the edge second dummy structure 126b and the second dummy structure 126 disposed in an oblique direction with respect to the edge second dummy structure 126b may be increased. The edge second dummy structure 126b may be formed in a dummy hole, and the dummy hole may be formed by photolithography process using a reticle of a bar type of a "¬" shape.

Thus, the spacing between the edge second dummy structure 126b and the second dummy structure 126 disposed in the oblique direction with respect to the edge second dummy structure 126b may be a second distance c1 greater than the first distance c. Thus, failures of the edge second dummy structure 126b may be reduced.

Figure 6:
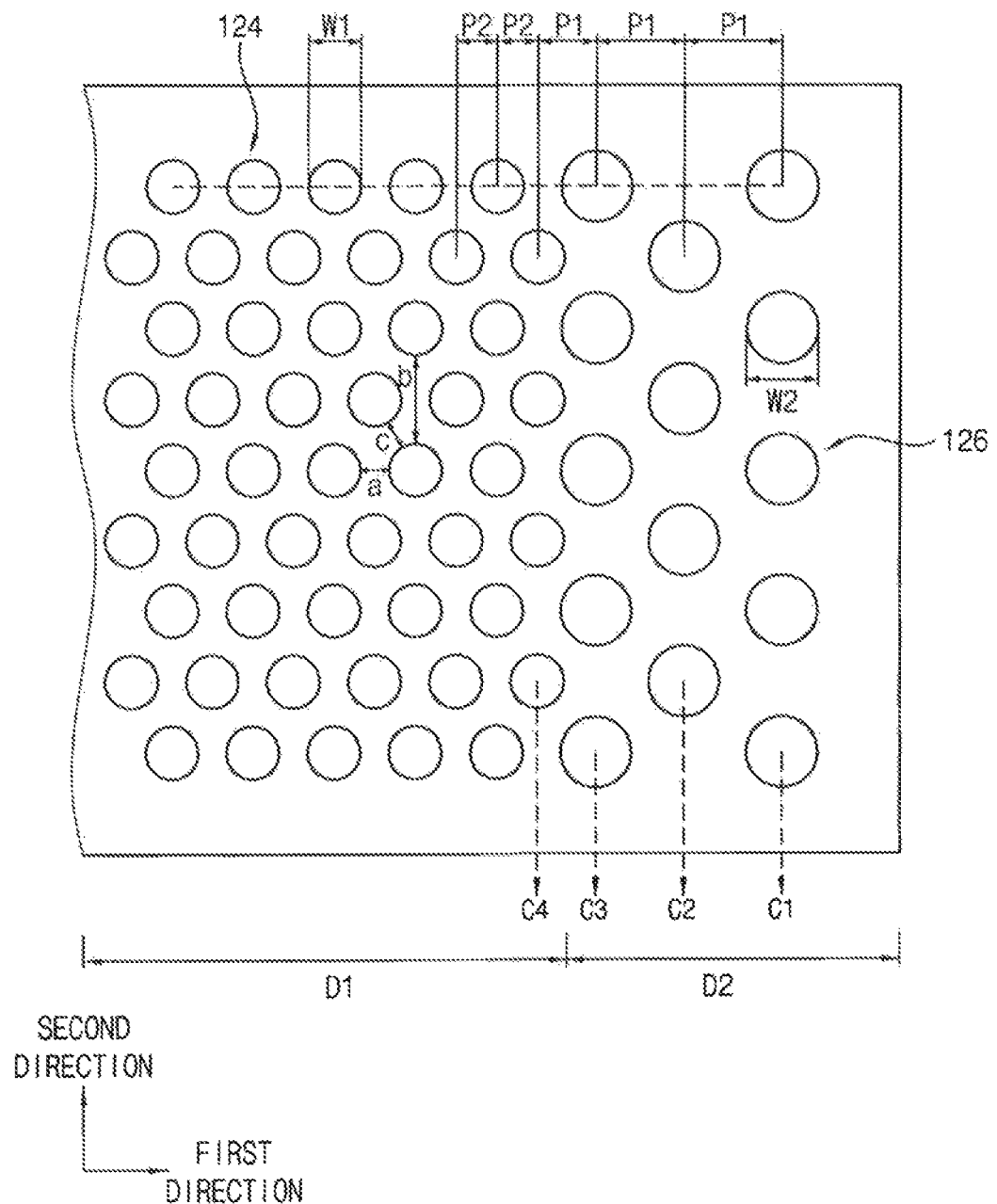

FIG. 6 is a plan view illustrating a portion of a vertical semiconductor device according to exemplary embodiments of the present inventive concept.

The vertical semiconductor device may be substantially the same as the vertical semiconductor device illustrated with reference to FIGS. 1 to 3, except for a shape of the second dummy structure 126.

Referring to FIG. 6, an upper surface of the second dummy structure 126 may have a second width W2 greater than a first width W1, which is a width of the first dummy structure 124. According to exemplary embodiments of the present inventive concept, the upper surfaces of the second dummy structures 126 may have the same width and may have a substantially circular shape. According to exemplary embodiments of the present inventive concept, the second width W2 may be about 105% to about 150% of the first width W1. For example, the second width W2 may be about 110% to 130% of the first width W1.

According to exemplary embodiments of the present inventive concept, the first dummy structures 124 of an odd-numbered column and an even-numbered column may be disposed in a zig-zag fashion in the first and/or second directions. For example, the first dummy structures 124 of an odd-numbered column and the first dummy structures 124 of an adjacent even-numbered column may be disposed in a staggered arrangement with respect to one another. In addition, the second dummy structures 126 of the odd-numbered column and the even-numbered column may be disposed in a zig-zag fashion in the first and/or second directions. According to an exemplary embodiment of the present inventive concept, central portions of the first and second dummy structures 124 and 126 of the odd-numbered column may be disposed in a straight line extending in the first direction. In addition, central portions of the first and second dummy structures 124 (for example, in column 4) and 126 of the even-numbered columns (for example, in column 2) may be disposed in a straight line extending in the first direction.

According to exemplary embodiments of the present inventive concept, an arrangement of an edge second dummy structure may be different from an arrangement of the second dummy structure 126 adjacent to the edge second dummy structure 126a in the second direction. For example, similar to FIG. 4, the edge second dummy structure 126a may not have a center positioned in the same straight line that extends in the first direction to pass through central portions of the first dummy structures 124 within a same row disposed at an edge of the first region R1 in the second direction. In other words, the edge second dummy structure 126a may be disposed to closer to an edge in the second direction of the conductive pattern structure 140, and therefore may not have a center aligned with centers of the first dummy structures 124 in an adjacent row r.

According to exemplary embodiments of the present inventive concept, a shape of an edge second dummy structure may be different from a shape of the second dummy structure 126 adjacent to the edge second dummy structure in the second direction. For example, similar to FIG. 5, the edge second dummy structure may have an irregular shape including a concave portion in an oblique direction.

Figure 7:
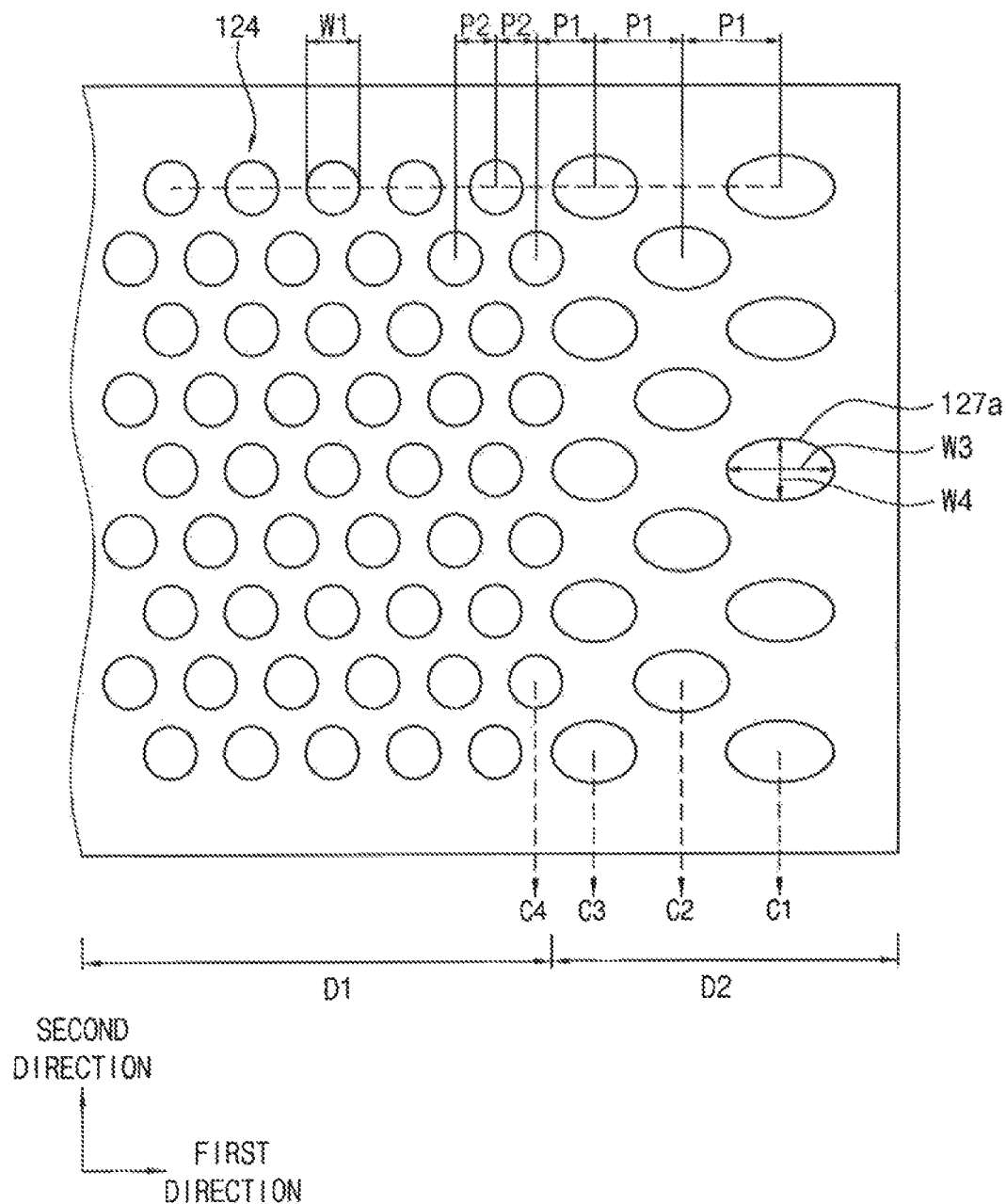

FIG. 7 is a plan view illustrating a portion of a vertical semiconductor device in accordance with exemplary embodiments of the present inventive concept.

The vertical semiconductor device depicted in FIG. 7 may be substantially the same as the vertical semiconductor device illustrated with reference to FIGS. 1 to 3, except for a shape of the second dummy structure.

Referring to FIG. 7, a shape of an upper surface of the second dummy structure 127a may be different from a shape of an upper surface of each of the channel structure 122 and the first dummy structure 124. According to exemplary embodiments of the present inventive concept, the upper surface of the second dummy structure 127a may have an elliptical shape having a longer length in the first direction. The second dummy structure 127a may have the first X-width W3 in the first direction and the first Y-width W4 in the second direction.

According to exemplary embodiments of the present inventive concept, the upper surfaces of the second dummy structures 127a disposed in the same column may have the same shape to each other.

According to an exemplary embodiment of the present inventive concept, the upper surface of the second dummy structure 127a may include a first X-width W3 and the first Y-width W4 which may be greater than the first width W1. The upper surface of the second dummy structure 127a may include a first X-width W3, which may be greater than the first width W1, and the first Y-width W4 which may be substantially the same as the first width W1.

According to exemplary embodiments of the present inventive concept, the first X-widths W3 of the upper surfaces of the second dummy structures 127a disposed at different columns may be different from each other. The first X-width W3 of the second dummy structure 126 of the first column C1 may be widest, and the first X-widths W3 of the second dummy structures may be gradually decreased from the first column C1 toward the third column C3. According to an exemplary embodiment of the present inventive concept, the first Y-width W4 of the second dummy structure 126 of the first column C1 may be widest, and the first Y-widths W4 of the second dummy structures may be gradually decreased from the first column C1 toward the third column C3.

An arrangement of the second dummy structures 127a may be substantially the same as the arrangement of the second dummy structures described above with reference to FIGS. 1 to 3.

That is, the first dummy structures 124 of an odd-numbered column and an even-numbered column may be disposed in a zig-zag arrangement with respect to one another in the first direction. In addition, the second dummy structures 127a of the odd-numbered column and the even-numbered column may be disposed in a zig-zag arrangement with respect to one another in the first direction. In this case, central portions of the first and second dummy structures 124 and 127a of the odd-numbered columns may be disposed in a straight line extending in the first direction. In addition, central portions of the first and second dummy structures 124 and 127a of the even-numbered column may be disposed in a straight line extending in the first direction.

According to exemplary embodiments of the present inventive concept, a spacing in the first direction between the central portions of the neighboring second dummy structures 127a and a spacing in the first direction between the central portions of the neighboring first and second dummy structures 124 may be referred to as a first spacing P1. The first spacing P1 may be greater than a second spacing P2, which is a spacing in a first direction between central portions of the neighboring first dummy structures 124 in adjacent columns. In the second dummy region D2, the first spacings P1 may be different from each other depending on positions of adjacent columns. For example, the first spacing P1 measured in the first direction between the central portions of the second dummy structures 127a in columns 1 and 2 adjacent to the second region R2 may have the widest P1, and the first spacing P1 may gradually decrease between consecutive columns toward the first dummy region D1.

Figure 8:
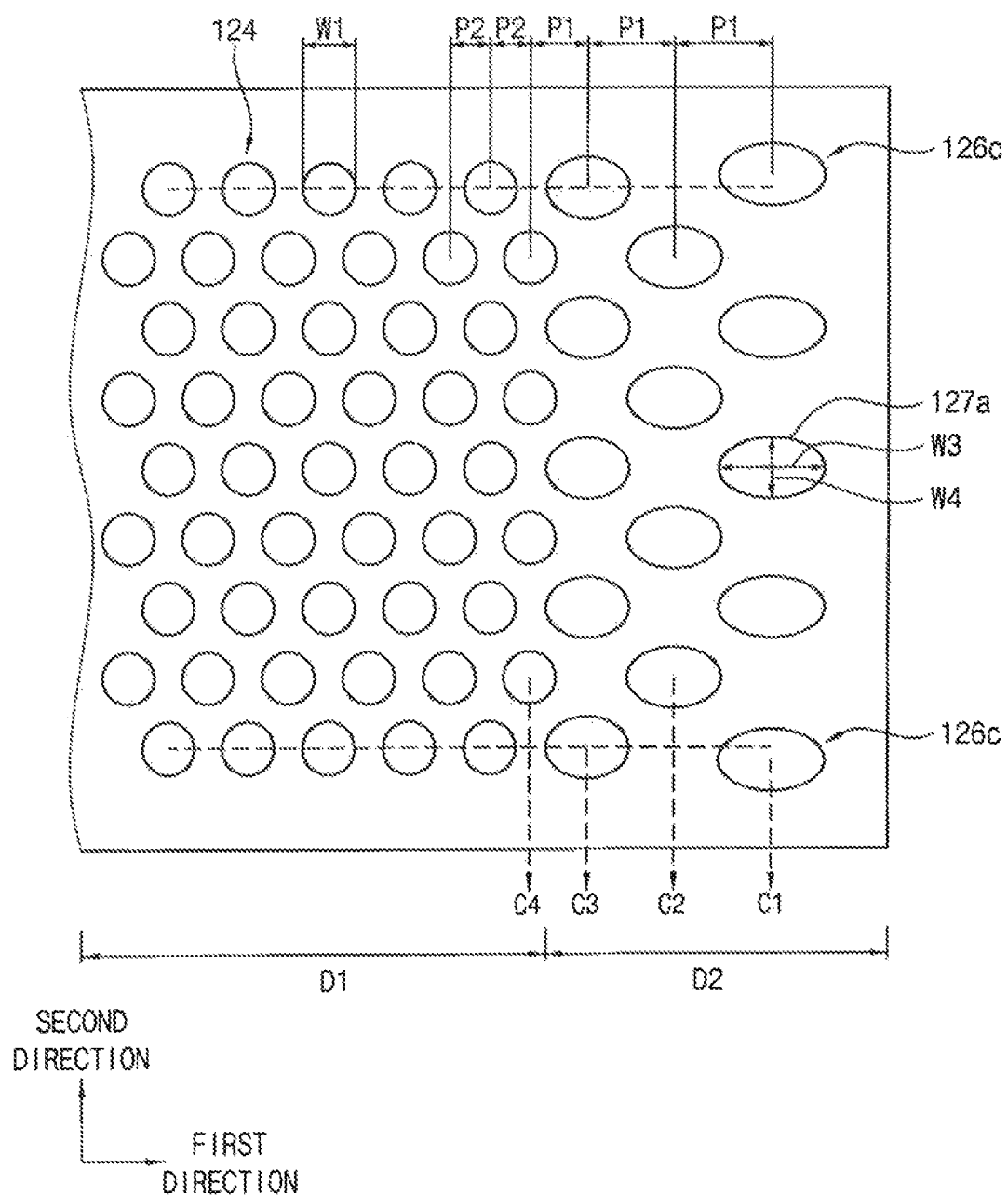

FIG. 8 is a plan view illustrating a portion of a vertical semiconductor device in accordance with exemplary embodiments of the present inventive concept.

In the vertical semiconductor device, a shape of the second dummy structure may be substantially the same as that illustrated with reference to FIG. 7. However, an edge second dummy structure 126c disposed in the first column and at an edge in the second direction of the conductive pattern structure 140 may have an arrangement different from that of the other second dummy structures 127a disposed in the first column.

Referring to FIG. 8, the edge second dummy structure 126c may be disposed in the same area as the edge second dummy structure 126a described with reference to FIG. 4.

Figure 9:
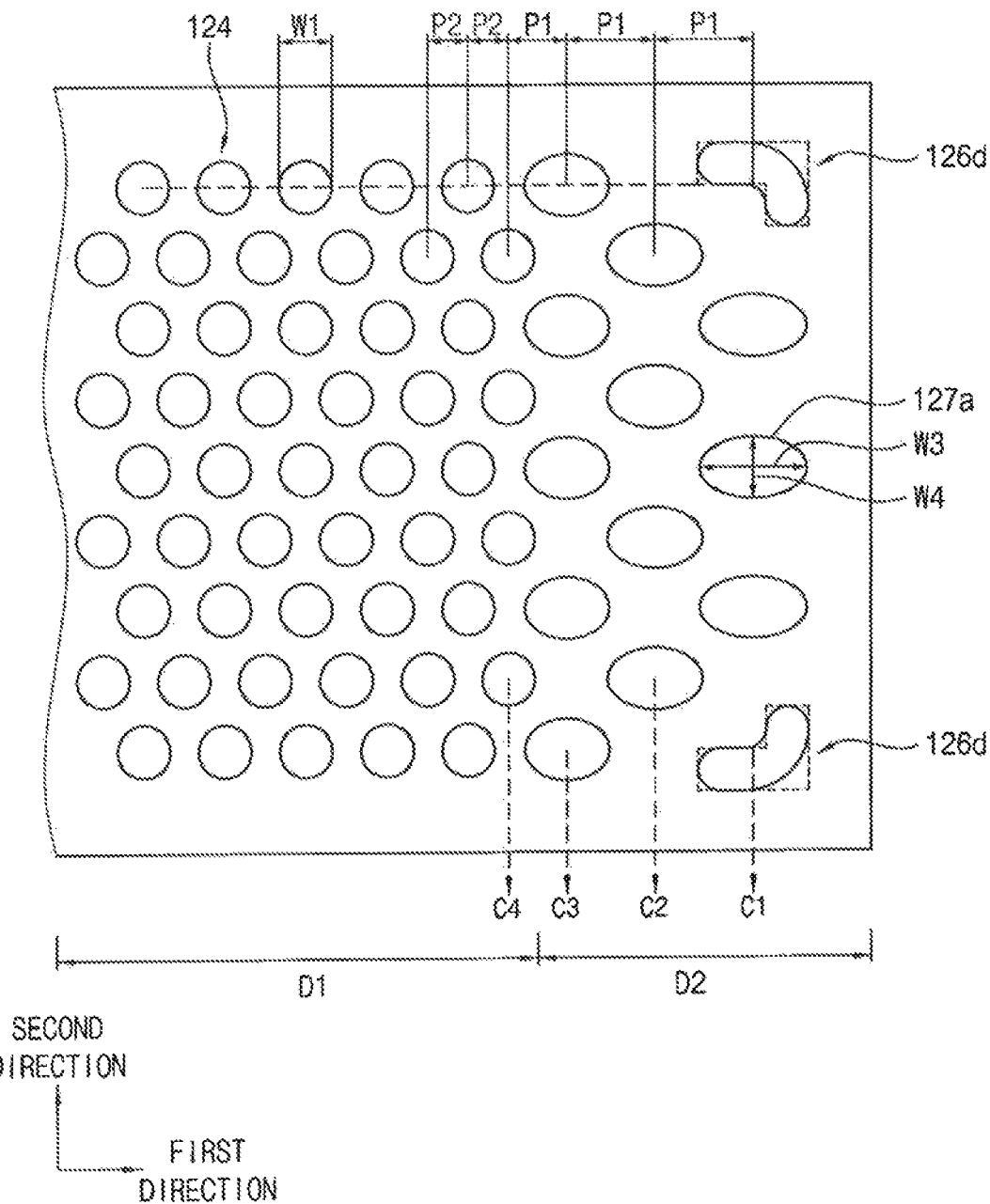

FIG. 9 is a plan view illustrating a portion of a vertical semiconductor device in accordance with an exemplary embodiment of the present inventive concept.

In the vertical semiconductor device, a shape of the second dummy structure may be substantially the same as that illustrated with reference to FIG. 7. However, an edge second dummy structure 126d may have a shape different from that of the other second dummy structures 127a disposed in the same first column.

Referring to FIG. 9, the shape of the edge second dummy structure 126d may be substantially the same as the shape of the edge second dummy structure 126b described with reference to FIG. 5.

Figure 10:
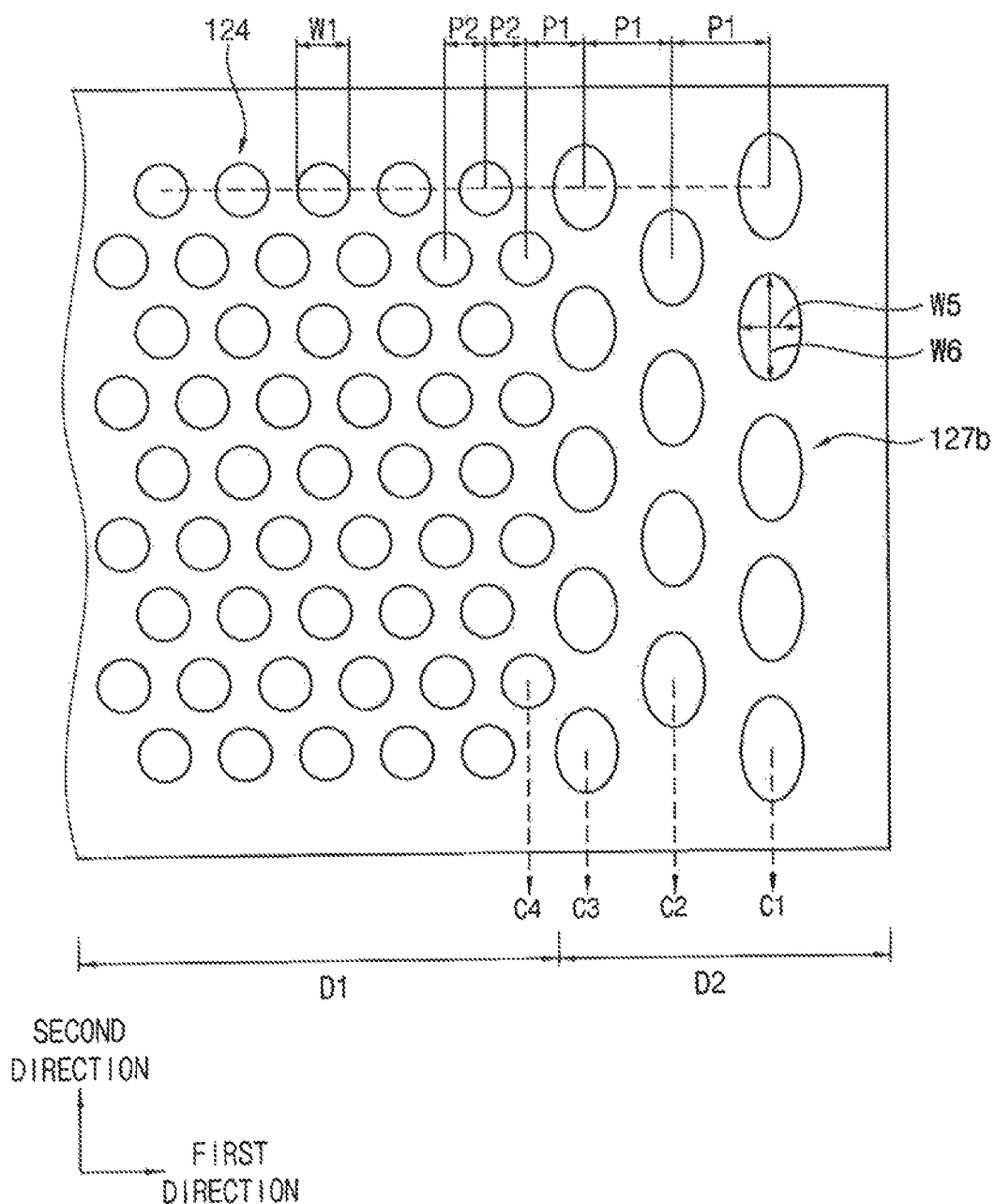

FIG. 10 is a plan view illustrating a portion of a vertical semiconductor device in accordance with exemplary embodiments of the present inventive concept.

In the vertical semiconductor device, a shape of the second dummy structure 127b may be different from shapes of the channel structure 122 and the first dummy structure 124.

In example embodiments, an upper surface of the second dummy structure 127b may have an elliptical shape having a longer length in the second direction. The second dummy structure 127b may have a second X-width W5 in the first direction and a second Y-width W6 in the second direction.

According to exemplary embodiments of the present inventive concept, in the upper surface of the second dummy structure 127b, each of the second X-width W5 and the second Y-width W6 may be greater than the first width W1. According to an exemplary embodiment of the present inventive concept the upper surface of the second dummy structure 127b may include the second X-width W5 that may be substantially the same as the first width W1, and the second Y-width W6 that may be greater than the first width W1.

According to exemplary embodiments of the present inventive concept, the second Y-widths W6 of the upper surfaces of the second dummy structures 127b disposed in different columns may be different from each other. According to exemplary embodiments of the present inventive concept, the second Y-width W6 of the second dummy structure 127b of the first column C1 may be the largest compared to other columns, and the second Y-widths W6 of the second dummy structures 127b may be gradually decreased from the first column C1 toward the third column C3. According to exemplary embodiments of the present inventive concept, the second X-width W5 of the second dummy structure 127b of the first column C1 may be widest, and the second X-widths W5 of the second dummy structures 127b may be gradually decreased from the first column C1 toward the third column C3.

The second dummy structures 127b may be arranged in the same manner as the second dummy structures illustrated with reference to FIGS. 1 to 3.

Figure 11:
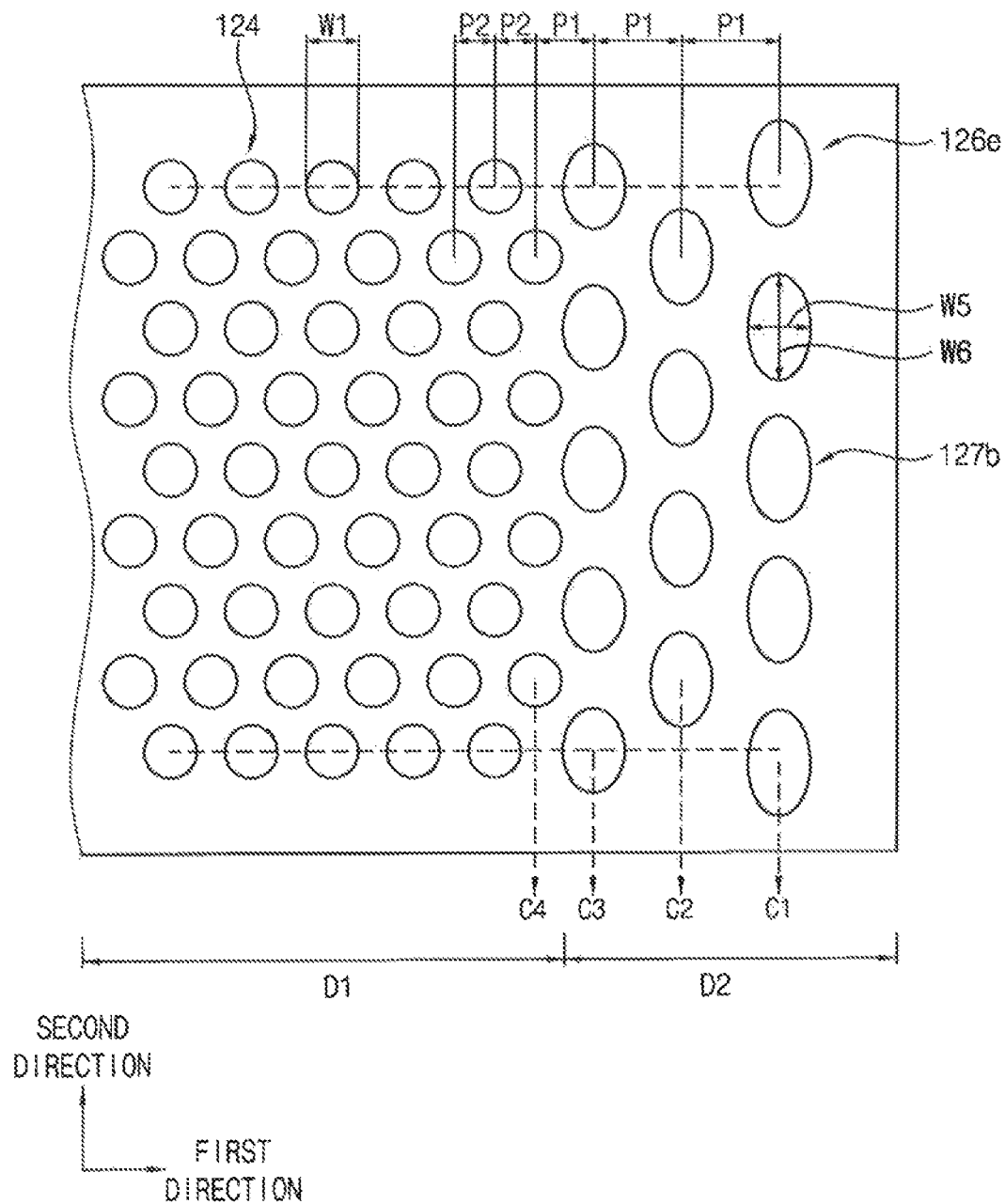

FIG. 11 is a plan view illustrating a portion of a vertical semiconductor device in accordance with an exemplary embodiment of the present inventive concept.

The vertical semiconductor device according to the exemplary embodiment of FIG. 11 may be substantially the same as the vertical semiconductor device illustrated with reference to FIG. 10, except for an edge second dummy structure.

Referring to FIG. 11, an arrangement of the second dummy structures 127b may be substantially the same as the arrangement of the second dummy structures 127b illustrated with reference to FIG. 10. The edge second dummy structure 126e may be disposed in the same area as the edge second dummy structure 126a described with reference to FIG. 4.

Figure 12:
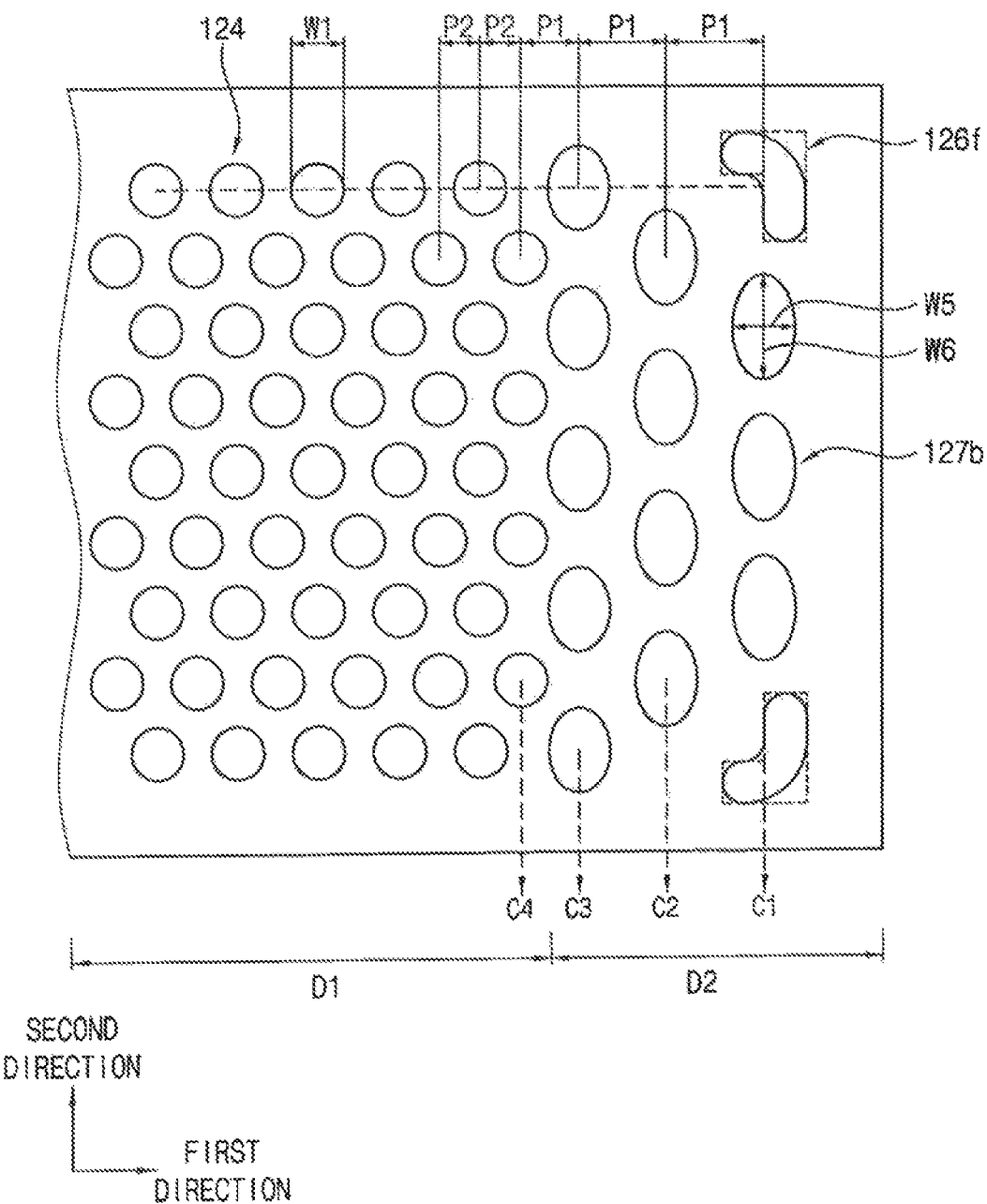

FIG. 12 is a plan view illustrating a portion of a vertical semiconductor device in accordance with an exemplary embodiment of the present inventive concept.

The vertical semiconductor device according to the exemplary embodiment depicted in FIG. 12 may be substantially the same as the vertical semiconductor device illustrated with reference to FIG. 10, except for an edge second dummy structure.

Referring to FIG. 12, a shape of the edge second dummy structure 126f may be substantially the same as a shape of the edge second dummy structure 126b described with reference to FIG. 5.

FIGS. 13 to 23 are cross-sectional views and plan views illustrating stages of a method of manufacturing a vertical semiconductor device in accordance with an exemplary embodiment of the present inventive concept.

Particularly, FIGS. 13, 14, 16, 17, 19, 20 and 22 are cross-sectional views, and FIGS. 15, 18, 21 and 23 are plan views. The method of manufacturing the vertical semiconductor device in accordance with the exemplary embodiments described above may be substantially the same, except for an arrangement and a shape of the channel hole and the first and second dummy holes. Hereinafter, a method of manufacturing the vertical semiconductor device shown in FIGS. 1, 2 and 3 is described.

Figure 13:
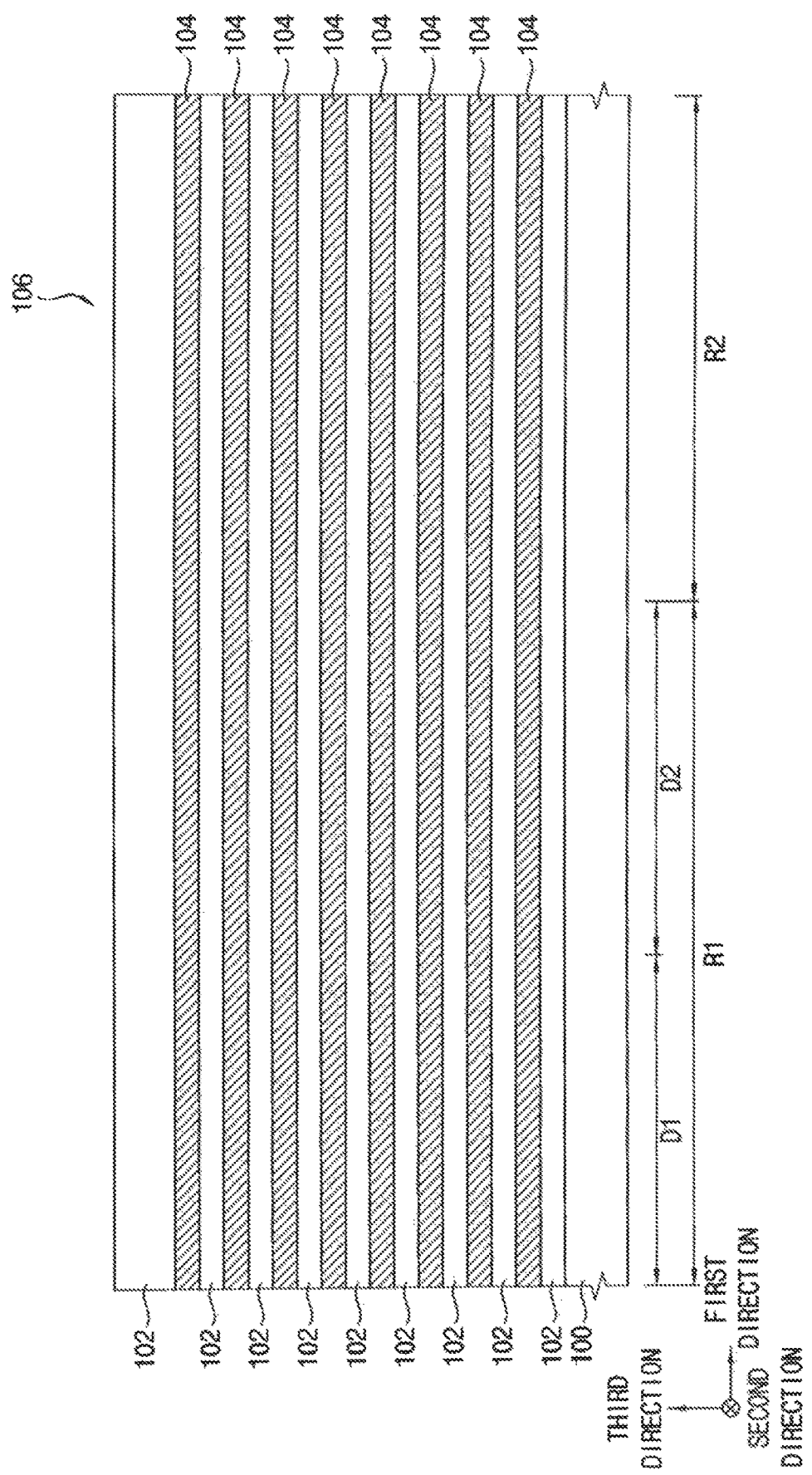

Referring to FIG. 13, insulation layers 102 and sacrificial layers 104 may be alternately and repeatedly stacked on the substrate 100 to form a preliminary mold structure 106 disposed on first and second regions R1 and R2 of a substrate 100. The first region R1 may include a cell region C (shown in FIG. 1), a first dummy region D1 and a second dummy region D2.

According to exemplary embodiments of the present inventive concept, a lowermost insulation layer 102 may serve as a pad insulation layer. An uppermost insulation layer 102 may have a thickness greater than those of lower insulation layers 102 in the preliminary mold structure 106.

The insulation layers 102 may be formed of an oxide-based material, e.g., silicon oxide, SiC, SiOF, etc. The sacrificial layers 104 may be formed of a nitride-based material, e.g., silicon nitride and/or silicon boronitride.

Figure 14:
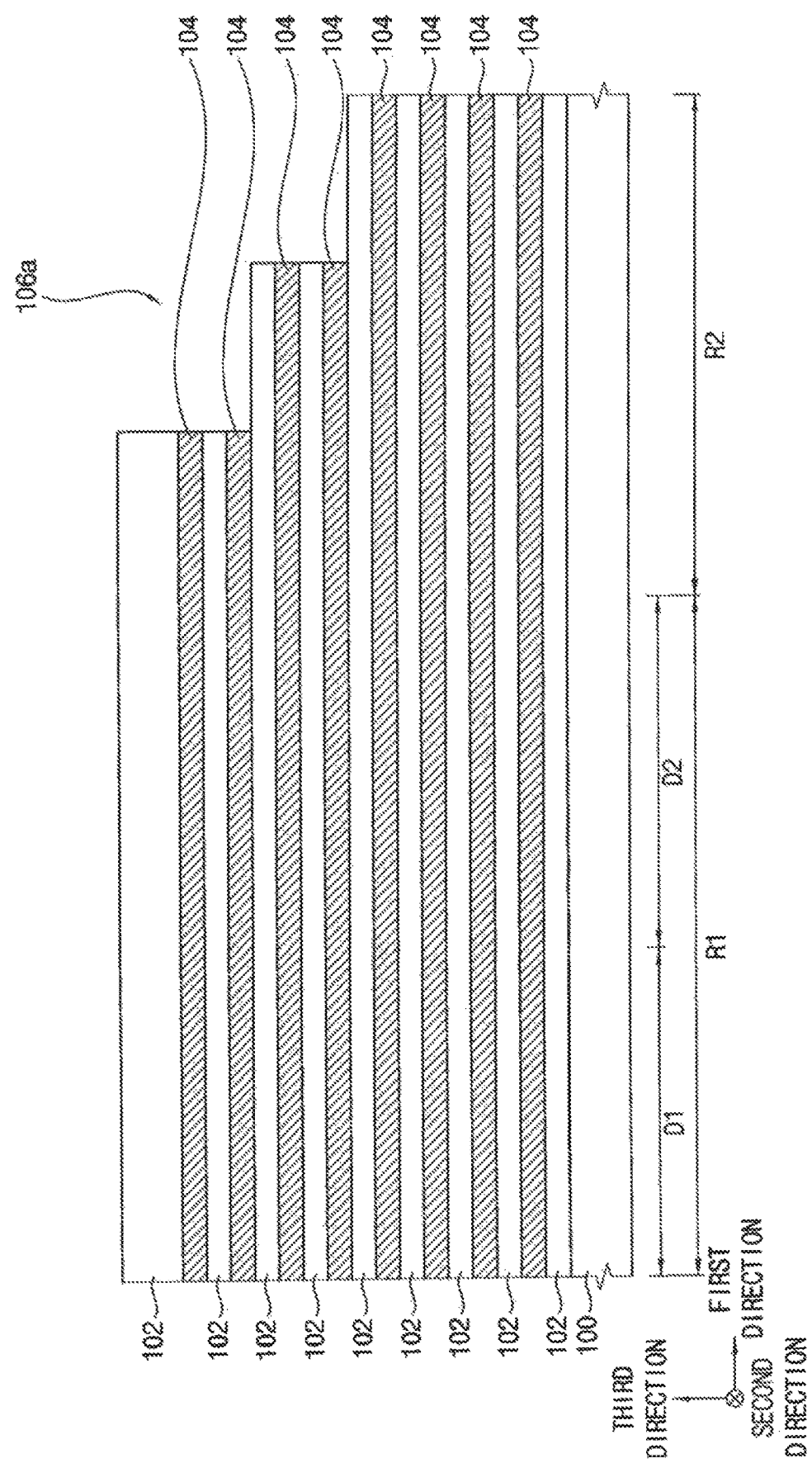
Figure 15:
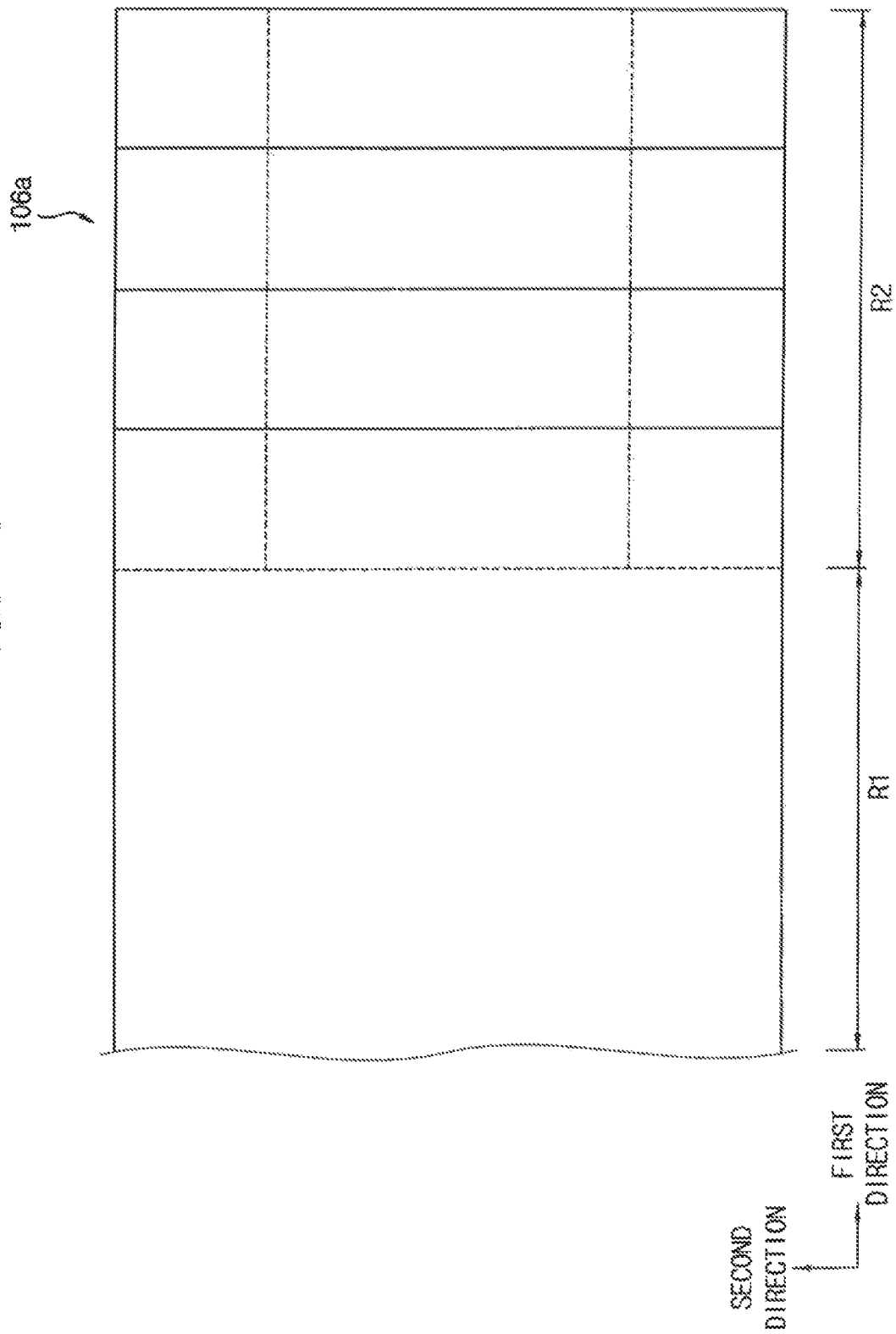

Referring to FIGS. 14 and 15, edge portions of the preliminary mold structure 106 on the second region R2 may be sequentially etched to form a preliminary step mold structure 106a having a staircase shape on the second region.

In exemplary embodiments of the present inventive concept, the preliminary step mold structure 106a on the second region R2 may have the staircase shape in the first and second directions. For example, the preliminary step mold structure 106a may have two steps in the second direction.

Only a portion of the staircase shape in the preliminary step mold structure 106a may be illustrated. In addition, the number of steps formed in each of the first and second directions is not limited to that shown.

The sacrificial layers 104 of the preliminary step mold structure 106a may be replaced with conductive patterns by subsequent processes.

Figure 16:
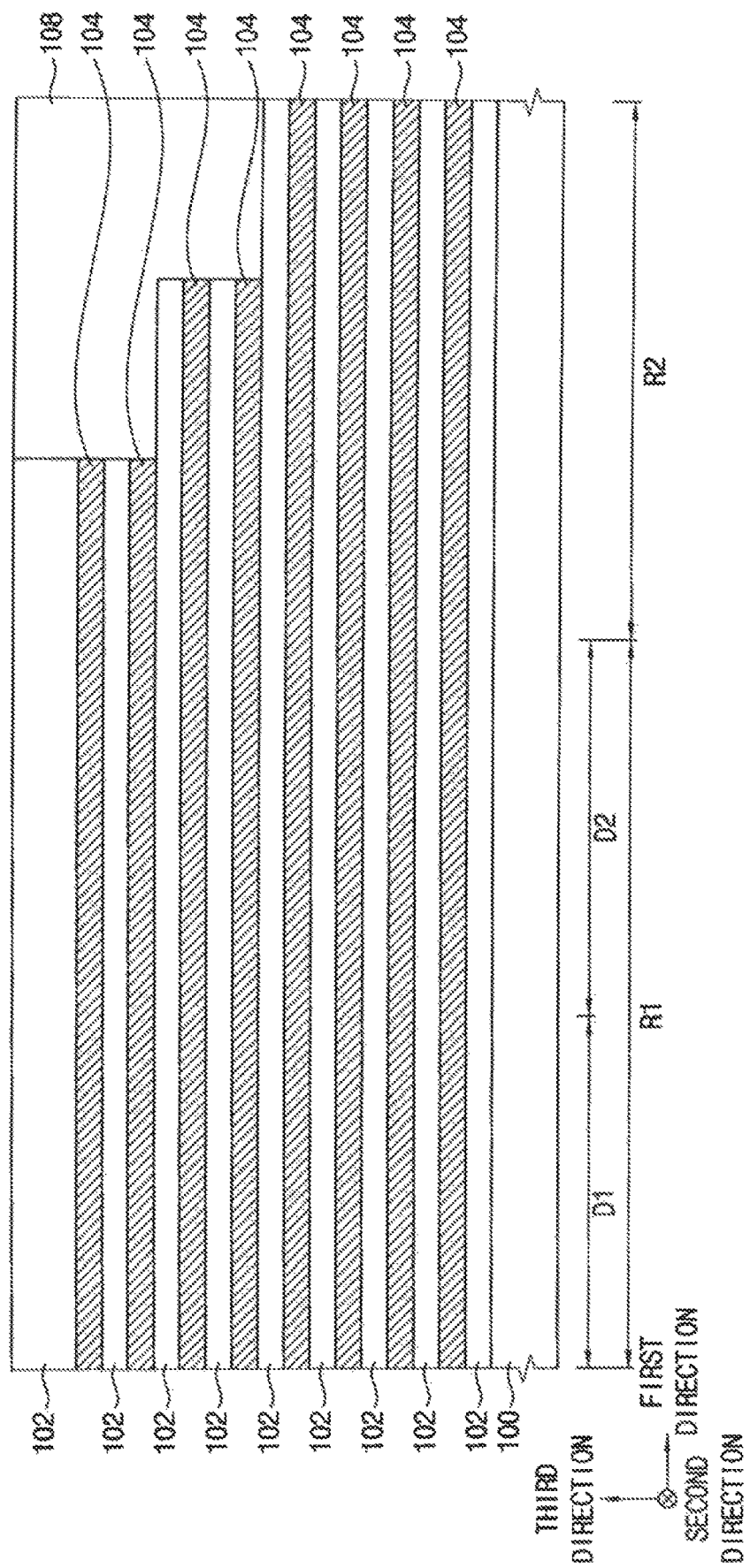

Referring to FIG. 16, a first upper insulating interlayer 108 may be formed to cover the preliminary step mold structure 106a disposed in the second region R2. An upper surface of the first upper insulating interlayer 108 may be substantially flat. The first upper insulating interlayer 108 may cover at least a step portion of the preliminary step mold structure 106a. According to an exemplary embodiment of the present inventive concept, the first upper insulating interlayer 108 and the uppermost insulation layer 102 may be merged into an insulation layer having a flat upper surface. In other words, upper surfaces of the first upper insulating interlayer 108 and the insulation layer 102 may be planarized.

The first upper insulating interlayer 108 may be formed by depositing an oxide layer including, e.g., silicon oxide, SiC or SiOF, and planarizing an upper surface of the oxide layer. The planarization process may include a chemical mechanical polishing (CMP) process and/or an etch back process.

Figure 17:
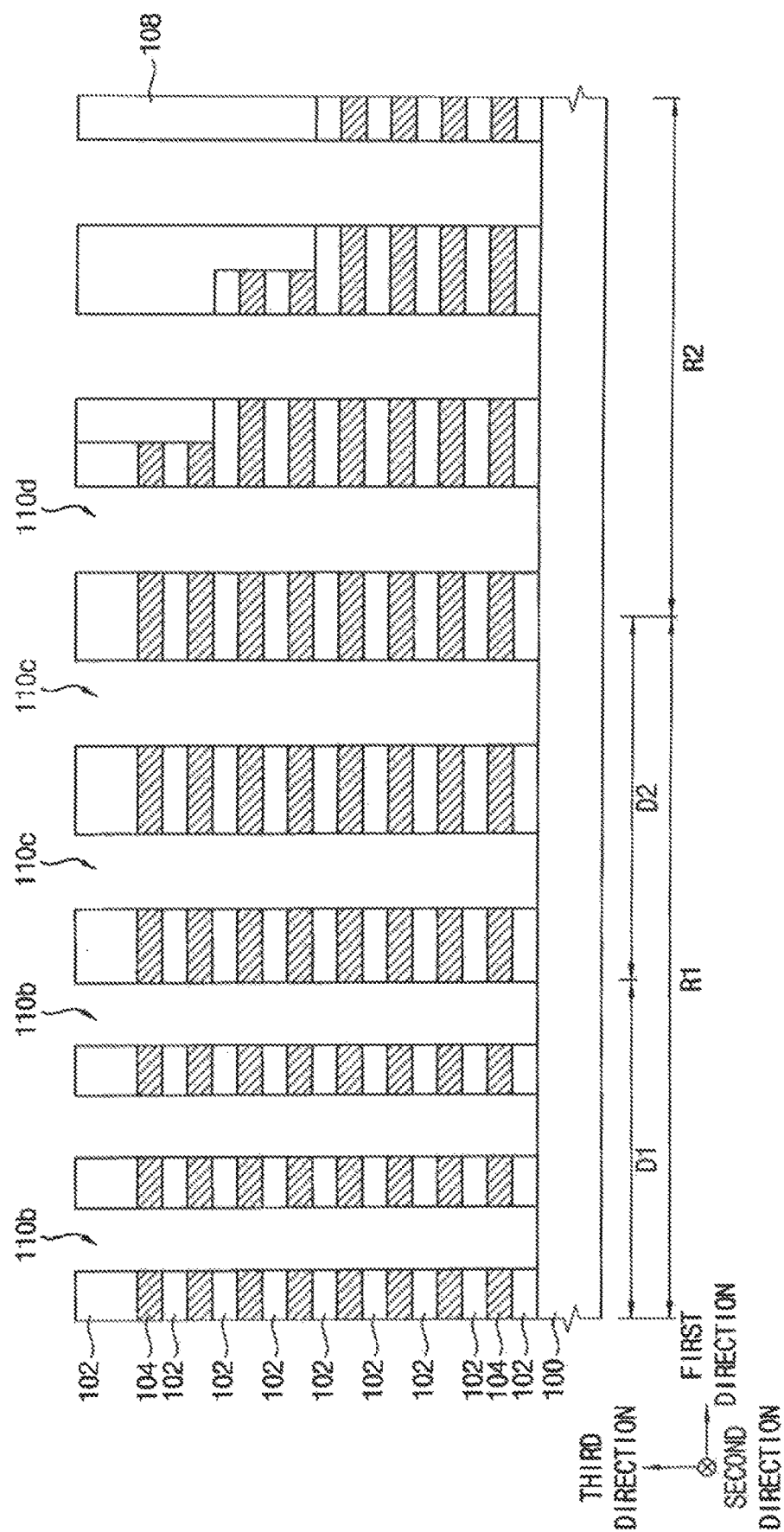
Figure 18:
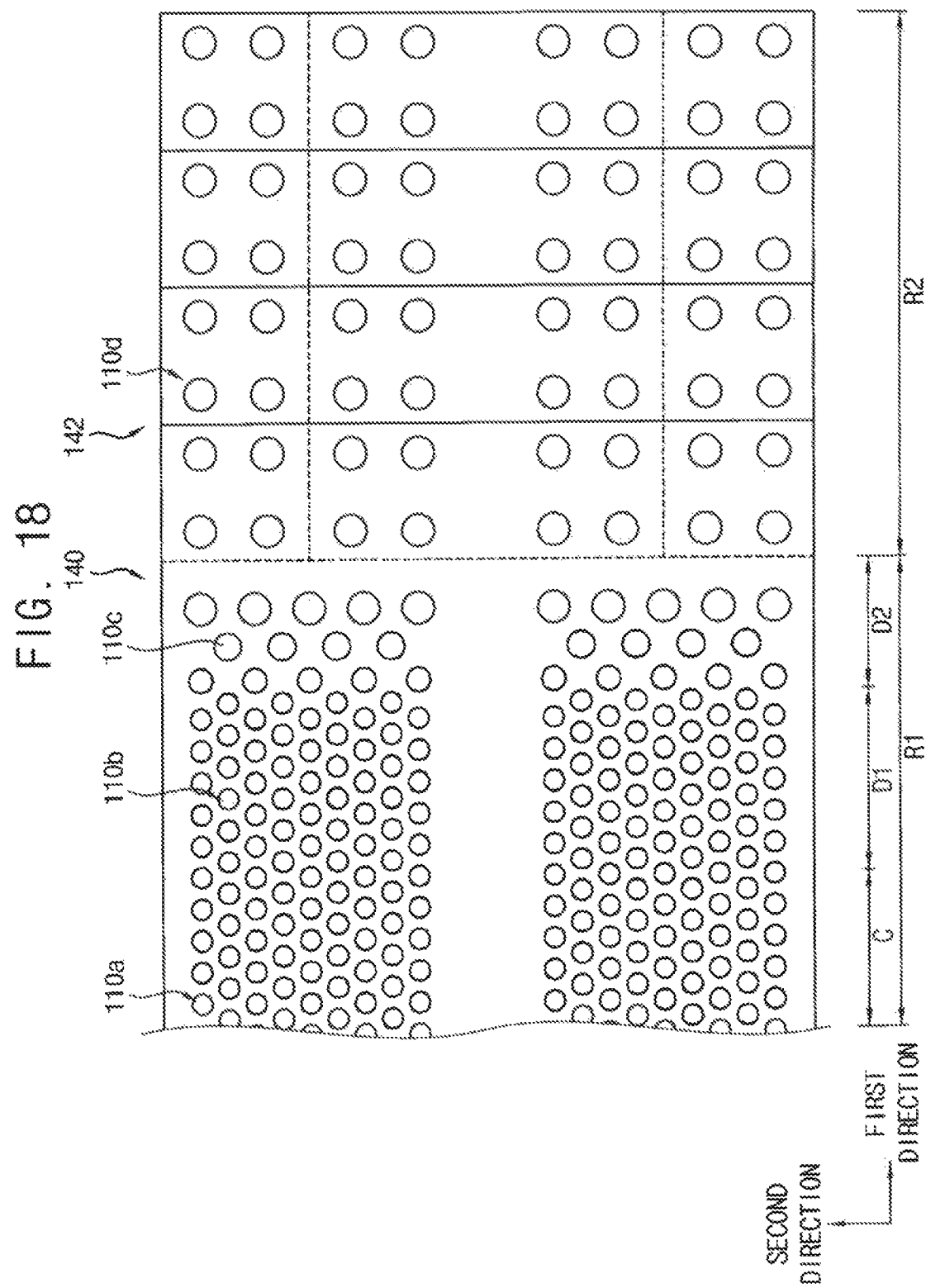

Referring to FIGS. 17 and 18, the preliminary step mold structure 106a and the first upper insulating interlayer 108 may be anisotropically etched to form a plurality of holes 110a, 110b, 110c and 110d exposing an upper surface of the substrate 100. The holes 110a, 110b, 110c and 110d may extend through the preliminary step mold structure 106a and the first upper insulating interlayer 108. For example, the plurality of holes 110a, 110b, 110c, and 110d may extend through the preliminary step mold structure 106a and the first upper insulating interlayer 108 to expose an upper surface of the substrate 100.

In other words, a plurality of channel holes 110a, a plurality of first dummy holes 110b and a plurality of second dummy holes 110c may be formed through the preliminary step mold structure 106a in the first region R1. A plurality of third dummy holes 110d may be formed through the preliminary step mold structure 106a in the second region R2.

A channel structure may be subsequently formed in the channel hole 110a. A first dummy structure may be subsequently formed in the first dummy hole 110b. A second dummy structure 126 may be subsequently formed in the second dummy hole 110c. In addition, a third dummy structure 128 may be subsequently formed in the third dummy hole 110d.

According to exemplary embodiments of the present inventive concept, arrangements and upper surface shape of the channel hole 110a and the first dummy hole 110b may be substantially the same as arrangements and shapes of the channel structure and the first dummy structure described with reference to FIGS. 1 to 3, respectively. In other words, upper portions of the channel holes 110a and the first dummy holes 110b may have circular shapes. An arrangement and an upper surface shape of the third dummy hole 110d (viewed from a plan view) may be substantially the same as the arrangement and the shape of the third dummy structure described with reference to FIGS. 1 to 3, respectively.

According to exemplary embodiments of the present inventive concept, the upper portion of each of the channel holes 110a and the first dummy holes 110b may have a first width W1. The second dummy holes 110c may be disposed in a plurality of columns from a last column C1 in the first direction in the first region R1. The upper surface portion of the second dummy holes 110c may have a second width W greater than the first width W1.

When the widths of the second dummy holes 110c are formed to be excessively wide, layers may not be normally filled in the second dummy holes 110c in a subsequent process. Therefore, the second dummy structure may not have a normal structure. Thus, a widest upper width of the second dummy holes 110c may be about 105% to about 150% of the first width. For example, the widest upper width of the second dummy holes 110c may be about 110% to about 130% of the first width.

A first spacing in the first direction between the central portions of neighboring second dummy holes 110c may be greater than a second spacing in the first direction between the central portions of neighboring first dummy holes. In the second dummy region, the first spacings may be different from each other depending on positions. For example, the first spacing in the first direction between the central portions of the second dummy holes adjacent to the second region may be widest, and the first spacing may be gradually decreased between consecutive columns nearer to the first dummy region.

In addition, a minimum distance between adjacent second dummy holes 110c may be equal to or greater than a minimum distance between the adjacent first dummy holes 110b.

In the first region R1, the second dummy holes 110c may be formed in the columns adjacent to the second region R2 and may include a different arrangement density of the holes. Thus, the second dummy holes 110c may experience failure due to an etching loading. For example, in the second dummy holes 110c formed in the second dummy region D2 of the first region R1, the not open failures in which a surface of the substrate 100 may not be exposed by a bottom of the second dummy holes may easily occur. However, as described above, as the width of the second dummy holes 110c is relatively wide and the distance between the second dummy holes 110c is relatively increased, the not open failures of the second dummy holes 110c due to the etching loading may be reduced.

The second dummy holes 110c nay be differently formed according to the arrangement and the shape of the second dummy structure in accordance with exemplary embodiments of the present inventive concept. In FIGS. 17 and 18, the arrangement and the shape of the second dummy holes 110c may be applicable to manufacturing the semiconductor device shown in FIGS. 1 to 3.

According to an exemplary embodiment of the present inventive concept, when the second dummy structures 126 shown in FIG. 3 are formed, a reticle may be used for forming the second dummy hole 110c and may include a square shape larger than a reticle used for forming the first dummy hole 110b. Thus, the upper surface portion of the second dummy hole 110c may have a circular shape when viewed in a plan view. An upper surface width of the second dummy holes 110c in the second dummy region D2 may gradually increase in columns toward the second region R2 in the first direction.

According to exemplary embodiments of the present inventive concept, the first dummy holes 110b of an odd-numbered column and an even-numbered column may be disposed in a zig-zag arrangement extending in the first direction. In addition, the second dummy holes 110c of the odd-numbered column and the even-numbered column may be disposed in a zig-zag arrangement extending in the first direction. According to exemplary embodiments of the present inventive concept, central portions of the first and second dummy holes 110*b* and 110*c* of odd-numbered columns may be disposed in a straight line extending in the first direction. For example, an imaginary line may intersect centers of first dummy holes 110*b* disposed in a same row r as one another and centers of second dummy holes 110*c* disposed in consecutive odd-numbered columns (C1 and C3, for example). In addition, central portions of the first and second dummy holes 110*b* and 110*c* of the even-numbered column may be disposed on a straight line extending in the first direction. For example, an imaginary line may intersect centers of second dummy holes 110*b* disposed in a same row as one another and centers of second dummy holes 110*c* disposed in consecutive even-numbered columns. Thus, the spacing in the second direction between the second dummy holes 110*c* of the same column may be equal to each other. In addition, the spacing in the second direction between the second dummy holes 110*c* may be gradually decreased toward the first column C1 adjacent to the second region R2.

According to an exemplary embodiment of the present inventive concept for forming the second dummy structures 126 shown in FIG. 4, the second dummy holes 110*c* may be formed similarly to the second dummy structures 126 shown in FIG. 3. For example, the dimensions, shapes, and distances attributed to the second dummy holes 110*c* according to the instant embodiment may be substantially similar to the exemplary embodiment depicted in FIG. 3. However, a position of an edge second dummy hole according to the instant exemplary embodiment of the present inventive concept may be different from that of the exemplary embodiment of the present inventive concept shown in FIG. 3. The edge second dummy hole may be disposed in the first column C1 adjacent to the second region R2 and including an edge portion disposed at an outer edge of the first region in the second direction of the conductive pattern structure 140. In other words, the edge second dummy holes may be disposed to be adjacent to the edge in the second direction of the conductive pattern structure. For example, the edge second dummy holes may be disposed as outermost second dummy holes 110*c* in the first column C1 and may be adjacent to a respective side edge of the first region R1 that is parallel to a plane of the first direction.

According to exemplary embodiment of the present inventive concept, for forming the second dummy structures shown in FIG. 5, the second dummy holes 110*c* may be formed with a similar shape and arrangement to the second dummy structure 126 shown in FIG. 3. However, a shape of an upper portion of an edge second dummy hole may be different from those of the other second dummy holes. The edge second dummy hole may be disposed in the first column C1 adjacent to the second region R2 and nearest an edge portion in the second direction of the conductive pattern structure 140.

According to exemplary embodiments of the present inventive concept for forming the second dummy structures 126 shown in FIG. 6, the second dummy holes 110*c* may be formed similarly to the second dummy structures 126 shown in FIG. 3. Therefore, upper portions of the second dummy holes 110*c* in the second dummy region D2 may have uniform width.

According to exemplary embodiment of the present inventive concept for forming the second dummy structures 127*a* shown in FIG. 7, the second dummy holes 110*c* may be formed similarly to the second dummy structure 126 shown in FIG. 3. However, a reticle used for forming the second dummy hole 110*c* may have a rectangular shape having a longer length in the first direction. Thus, the upper portion of the second dummy hole 110*c* may have an elliptical shape having a longer length in the first direction, viewed in a plan view.

According to exemplary embodiments of the present inventive concept for forming the second dummy structures shown in FIG. 8, the second dummy holes 110*c* may be formed similarly to the second dummy structure 127*a* shown in FIG. 7. However, the edge second dummy holes may be disposed to be closer to an edge of the conductive pattern structure 140 parallel to a plane in the second direction.

According to an exemplary embodiment of the present inventive concept for forming the second dummy structures 127*a* shown in FIG. 9, the second dummy holes 110*c* may be formed similarly to the second dummy structure 127*a* shown in FIG. 7. However, a shape of an upper portion of an edge second dummy hole may be differently shaped from those of other second dummy holes.

According to exemplary embodiments of the present inventive concept for forming the second dummy structures shown in FIG. 10, the second dummy holes 110*c* may be formed similarly to the second dummy structure 126 shown in FIG. 3. However, a reticle used for forming the second dummy hole 110*c* may have a rectangular shape having a longer length in the second direction. Thus, the upper portion of the second dummy hole 110*c* may have an elliptical shape having a longer length in the second direction, viewed in a plan view.

According to exemplary embodiments of the present inventive concept for forming the second dummy structures 127*b* shown in FIG. 11, the second dummy holes 110*c* may be formed similarly to the second dummy structure 127*b* shown in FIG. 10. However, the edge second dummy holes may be disposed to be closer to an edge of the conductive pattern structure 140 that is parallel to a plane of the second direction.

According to exemplary embodiments of the present inventive concept for forming the second dummy structures shown in FIG. 12, the second dummy holes 110*c* may be formed similarly to the second dummy structure 127*b* shown in FIG. 10. However, a shape of an upper portion of an edge second dummy hole may be different from those of the other second dummy holes.

Figure 19:
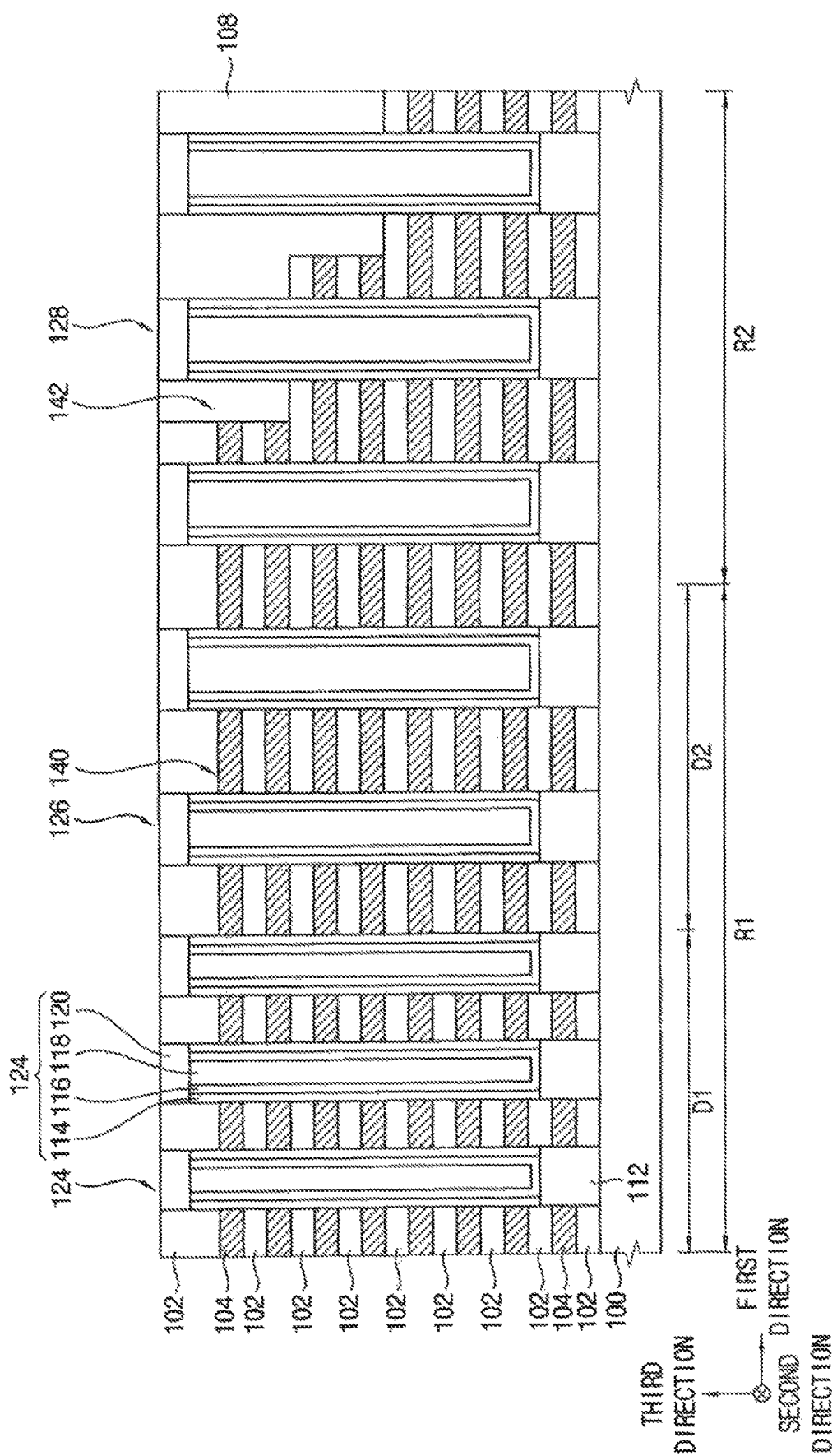

Referring to FIG. 19, a semiconductor pattern 112 may be formed on the upper surface of the substrate 100 exposed by each of the channel hole 110*a*, the first, second and third dummy holes 110*b*, 110*c*, and 110*d*. A channel structure may be formed to fill each of the channel holes 110*a*. A first dummy structure 124 may be formed to fill each of the first dummy holes 110*b*. A second dummy structure 126 may be formed to fill each of the second dummy holes 110*c*. A third dummy structure 128 may be formed to fill each of the third dummy holes 110*d*. Each of the channel structure and the first, the second and the third dummy structures 124, 126 and 128 may be formed on the semiconductor pattern 112.

Particularly, the semiconductor pattern 112 may be formed by a selective epitaxial growth (SEG) process using the upper surfaces of the substrate 100 exposed by the channel hole 110*a*, the first, second and third dummy holes 110*b*, 110*c* and 110*d* as a seed. The semiconductor pattern 112 may serve as a channel region of a ground selection transistor formed at a lowermost portion in the vertical semiconductor device. Thus, an upper surface of the semiconductor pattern 112 may be positioned at a portion of the insulation layer 102 between two lowermost sacrificial layers 104. For example, insulation layers 102 may be disposed to face one another across a channel hole 110a or dummy holes b-d, and a semiconductor pattern 112 may have opposite side surfaces disposed or adjacent insulation layers 102.

When the not open failures of at least one among the channel hole 110a and the first, second and third dummy holes 110b, 110c, and 110d occur in the previous process, epitaxial growth may not be normally performed so that the semiconductor pattern 112 may not be formed. Therefore, the channel structure 122 or the first to third dummy structures 124, 126, and 128 may not be normally formed in not opened holes, and thus current leakage may occur. However, since the channel hole 110a and the first to third dummy holes 110b, 110c, and 110d are arranged as described, the not open failure may be reduced.

When a difference between a width of each of the channel hole 110a and the first dummy holes 110b and a width of the second dummy holes 110c is large, a difference between a growth rate of an epitaxial layer from the substrate 100 in the second dummy hole 110c and a growth rate of an epitaxial layer from the substrate 100 in the channel hole 110a and the first dummy hole 110b may be increased. For example, when the width of the second dummy holes 110c is greater than about 150% of the width of each of the channel hole 110a and the first dummy holes 110b, the upper surface of the semiconductor pattern 112 in the second dummy hole may not be accurately positioned at the position of the insulation layer 102 between the two lowermost sacrificial layers, and may be formed at a lower position. When the upper surface of the semiconductor pattern 112 is not accurately positioned, the current leakage may occur at the semiconductor pattern 112. However, in exemplary embodiments of the present inventive concept, the width of the second dummy holes 110c may be in the range of about 105% to about 150% of the width of each of the channel hole 110a and the first dummy holes 110b, the upper surface of the semiconductor pattern 112 may be positioned at the portion of the insulation layer 102 between the two lowermost sacrificial layers 104.

The channel structure 122 and the first, second and third dummy structures 124, 126 and 128 formed on the semiconductor pattern 112 may have substantially the same stacked structure.

According to exemplary embodiments of the present inventive concept, each of the channel structure 122 and the first, second and third dummy structures 124, 126 and 128 may include a dielectric structure 114, a channel 116, a filling insulation pattern 118 and an upper conductive pattern 120.

The dielectric structure 114 may include a tunnel insulation layer, a charge storage layer and a blocking dielectric layer sequentially stacked on an outer sidewall of the channel 116. The channel 116 may be formed on the dielectric structure 114 and the semiconductor pattern 112. The filling insulation pattern 118 may be formed on the channel 116 to fill an inner space of the channel 116. The upper conductive pattern 120 may be formed on the dielectric structure 114, the channel 116, and the filling insulation pattern 118.

Figure 20:
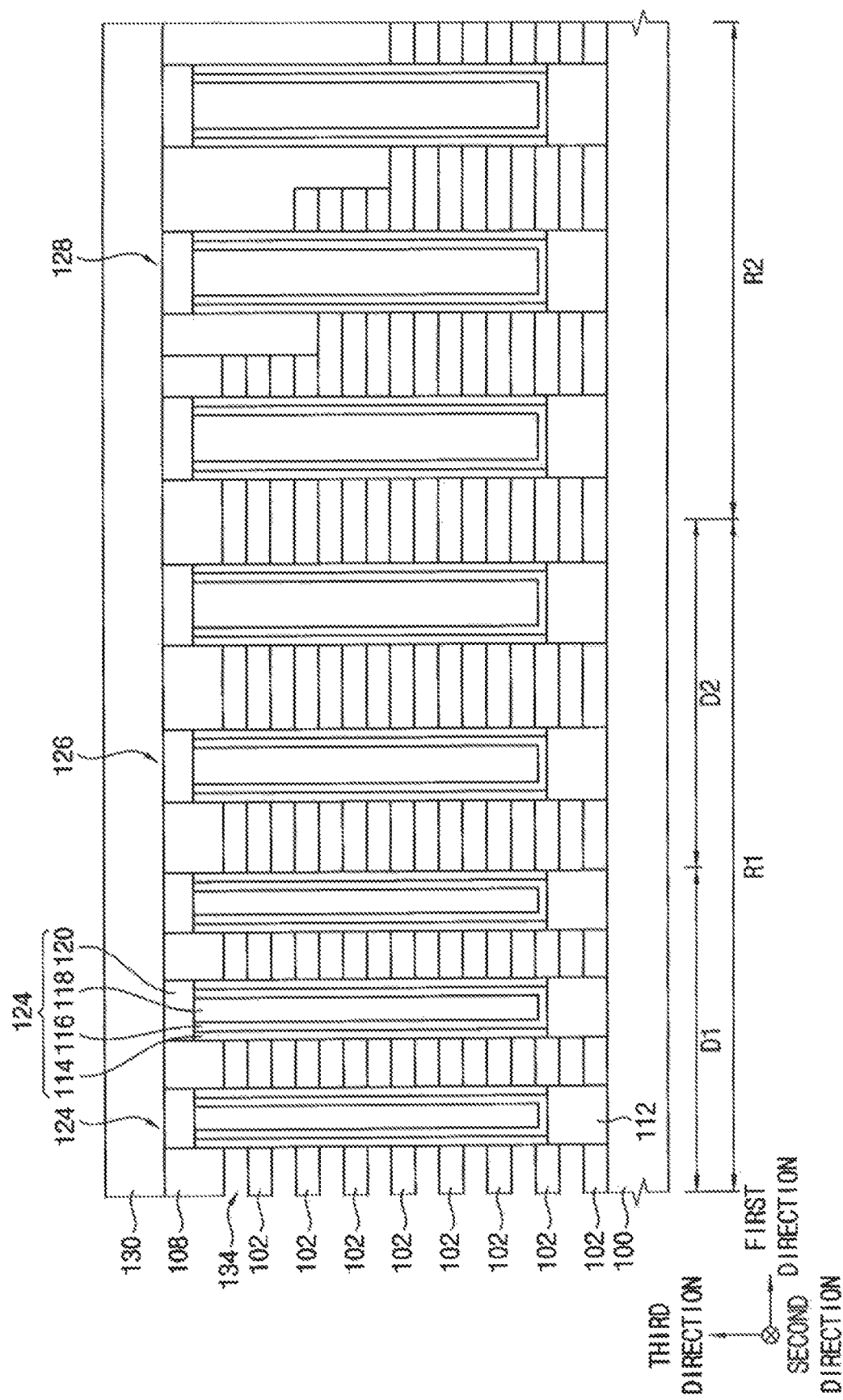
Figure 21:
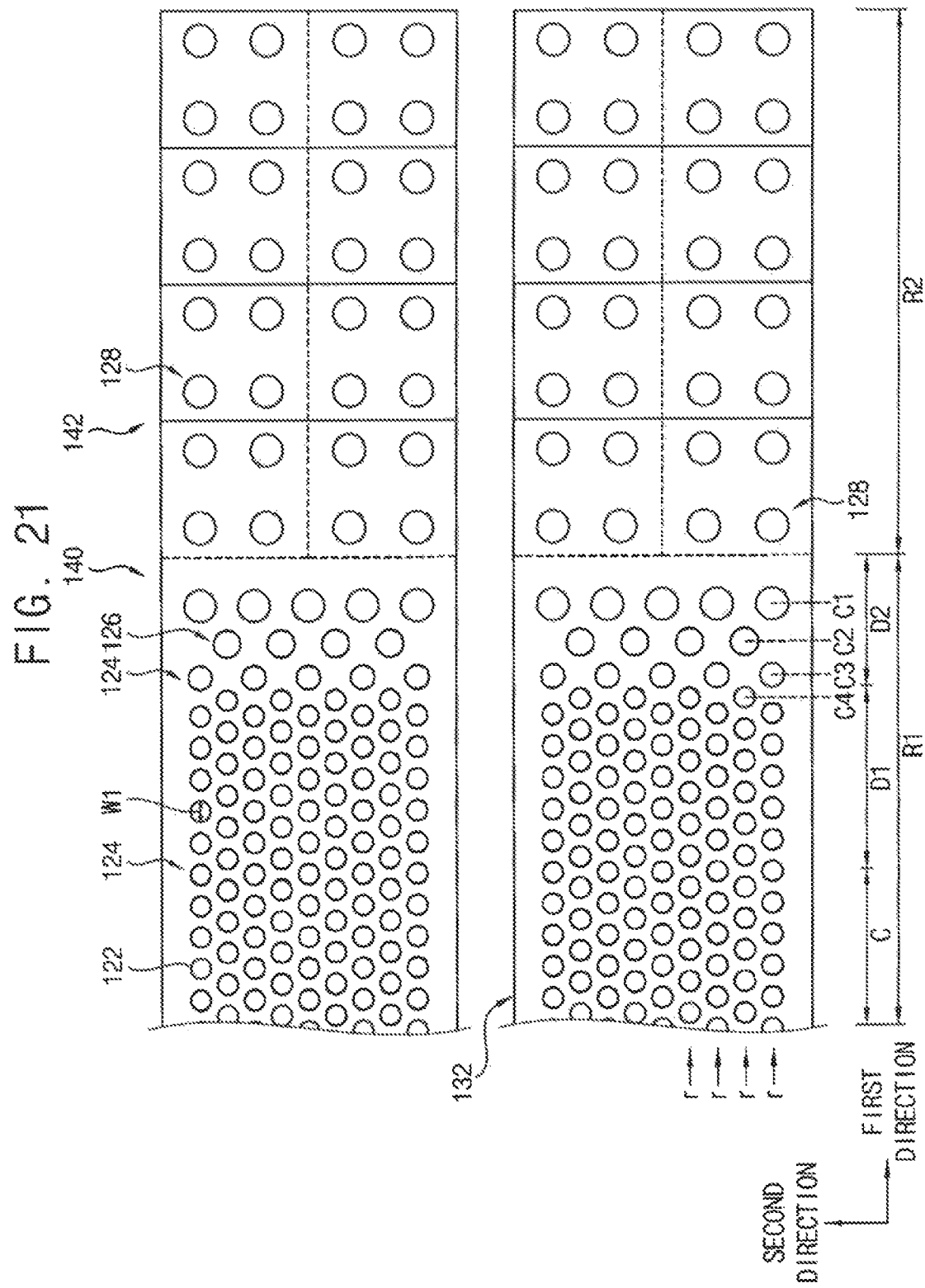

Referring to FIGS. 20 and 21, a second upper insulating interlayer 130 may be formed on the first upper insulating interlayer 108 and the preliminary step mold structure 106a. An upper surface of the second upper insulating interlayer 130 may be substantially flat.

The preliminary step mold structure 106a and the first and second upper insulating interlayers 108 and 130 may be anisotropically etched to form openings 132 extending in the first direction. Thus, the preliminary step mold structures 106a may be separated from each other so that a step mold structure may be formed at both sides of the opening 132. The surface of the substrate 100 may be exposed by a bottom of the opening 132.

Then, the sacrificial layers 104 exposed by a sidewall of the openings 132 may be removed. In exemplary embodiments of the present inventive concept, the sacrificial layers 104 may be removed by an isotropic etching process. As the sacrificial layers 104 are removed, a gap 134 may be formed between the insulation layers 102.

When the sacrificial layers 104 are removed, the insulation layer 102 of the step mold structure may be stably supported by the channel structures 122 and the first to third dummy structures 124, 126, and 128. Therefore, as the second dummy structure 126 may be properly formed and the gap may be maintained. In addition, contact between the insulation layers may be decreased.

Figure 22:
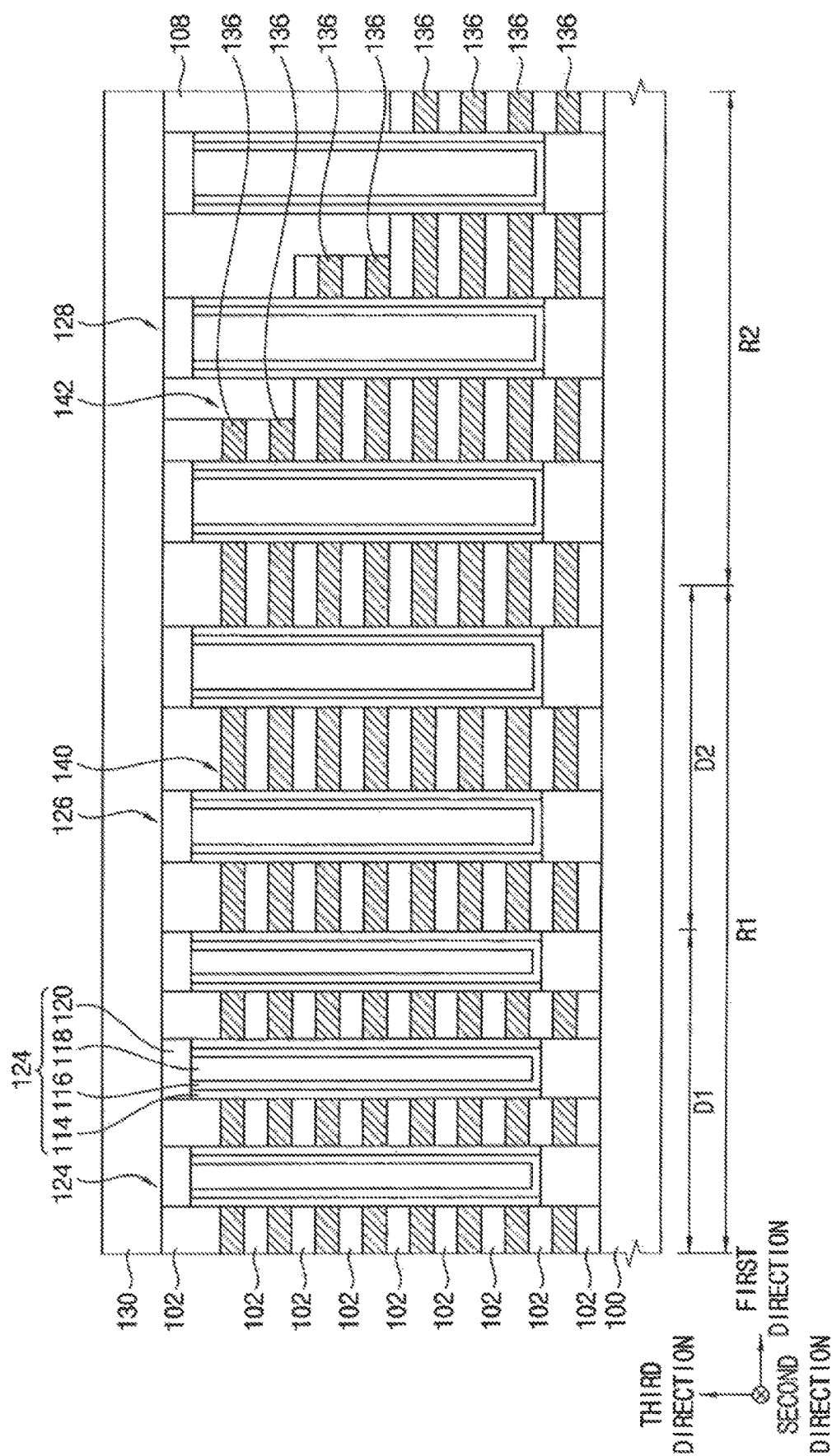

Referring to FIGS. 22 and 23, conductive materials may fill the gap so that the conductive patterns 136 may be formed in the first and second regions R1 and R2, respectively, between adjacent insulation layers 102.

Thus, a conductive pattern structure 140 including conductive patterns 136 and insulation layers 102 alternately stacked may be formed in the first region R1. In the second region R2, a pad structure 142 including the conductive patterns 136 and the insulation layer 102 may be stacked to include a step shape.

An insulation pattern 144 may fill the opening 132.

Then, contact plugs 138 may be formed through the first and second upper insulating interlayers 108 and 130, and the contact plugs 138 may contact the conductive patterns 136 of the pad structure 142, respectively. The contact plugs 138 may be spaced apart from the third dummy structure 128.

A wiring line may be formed on the second upper insulating interlayer 130 to be electrically connected with an upper surface of the contact plug 138. The wiring line may extend in the second direction.

By performing the above-described process, a vertical semiconductor device in accordance with exemplary embodiments of the present inventive concept may be manufactured.

While exemplary embodiments of the present inventive concept have been particularly shown and described, it will be understood by one of ordinary skill in the art that variations in form and detail may be made therein without departing from the spirit and scope of the present inventive concept as defined by the accompanying claims.

What is claimed is:

1. A vertical semiconductor device, comprising:
a substrate including a first region and a second region;
a conductive pattern structure disposed on the first region and extending in a first direction, the first region including a cell region, a first dummy region and a second dummy region;
a pad structure disposed on the second region, the pad structure contacting a side of the conductive pattern structure;
a plurality of first dummy structures extending through the conductive pattern structure on the first dummy region adjacent to the cell region; and
a plurality of second dummy structures extending through the conductive pattern structure on the second dummy region adjacent to the second region, the second dummy structures disposed in a plurality of columns that extend in a second direction perpendicular to the first direction, wherein widths of upper surfaces of the second dummy structures are different from each other in each of the columns, and the widths of upper surfaces of the second dummy structures gradually increase toward the second region.

2. The vertical semiconductor device of claim 1, further comprising a plurality of channel structures extending through the conductive pattern structure on the cell region, wherein an arrangement of the channel structures is substantially the same as an arrangement of the first dummy structures.

3. The vertical semiconductor device of claim 1, wherein upper surfaces of the first dummy structures have a uniform width, and a width of each of the upper surfaces of the second dummy structures is greater than the width of each of the upper surfaces of the first dummy structures.

4. The vertical semiconductor device of claim 1, wherein a spacing in the first direction between central portions of neighboring second dummy structures and a spacing in the first direction between central portions of neighboring first and second dummy structures is a first spacing, a spacing in the first direction between central portions of neighboring first dummy structures is a second spacing, and the first spacing is greater than the second spacing.

5. The vertical semiconductor device of claim 4, wherein first spacings in the second dummy region are different from each other, and
wherein widths of the first spacings decrease toward the first dummy region, and the first spacing in the first direction between the central portions of the second dummy structures adjacent to the second region is the widest of the first spacings.

6. The vertical semiconductor device of claim 1, wherein the first dummy structures and the second dummy structures are disposed in a zig-zag arrangement in the first direction, wherein central portions of the first and second dummy structures of odd-numbered columns are disposed in a straight line extending in the first direction, and the central portions of the first and second dummy structures of even-numbered columns are disposed in a straight line extending in the first direction.

7. The vertical semiconductor device of claim 1, wherein the second dummy structures include an edge second dummy structure that is adjacent to the second region and disposed at an edge portion in the second direction of the conductive pattern structure, and a spacing between the edge second dummy structure and the second dummy structure adjacent to the edge second dummy structure in the second direction is greater than a spacing between other second dummy structures adjacent to the second region.

8. The vertical semiconductor device of claim 1, wherein the second dummy structures include an edge second dummy structure that is adjacent to the second region and disposed at an edge portion in the second direction of the conductive pattern structure, and an upper surface of the edge second dummy structure has a shape different from a shape of other second dummy structures disposed within a same column.

9. The vertical semiconductor device of claim 8, wherein the upper surface of the edge second dummy structure that is adjacent to the second region and disposed at the edge portion in the second direction of the conductive pattern structure includes a concave.

10. The vertical semiconductor device of claim 1, wherein upper surfaces of the first and second dummy structures have a circular shape.

11. The vertical semiconductor device of claim 1, wherein upper surfaces of the first dummy structures have a circular shape, and upper surfaces of the second dummy structures have an elliptical shape having a longer length in one of the first direction or the second direction.

12. The vertical semiconductor device of claim 1, wherein a minimum distance between neighboring second dummy structures is substantially the same as or greater than a minimum distance between the neighboring first dummy structures.

13. The vertical semiconductor device of claim 1, wherein the conductive pattern structure and the pad structure include conductive patterns and insulation layers repeatedly stacked, and the pad structure has a step shape.

14. The vertical semiconductor device of claim 1, wherein a maximum width of the upper surfaces of the second dummy structures about 105% to about 150% of a width of an upper surface of one of the first dummy structures.

15. A vertical semiconductor device, comprising:
a substrate including a first region and second region;
a conductive pattern structure disposed on the first region and extending in a first direction, wherein the first region includes a cell region, a first dummy region adjacent to the cell region and a second dummy region adjacent to the second region;
a pad structure disposed on the second region adjacent to the first region, the pad structure contacting a side of the conductive pattern structure;
a plurality of first dummy structures extending through the conductive pattern structure on the first dummy region adjacent to the cell region; and
a plurality of second dummy structures extending through the conductive pattern structure on the second dummy region adjacent to the second region, wherein the second dummy structures are disposed in a plurality of columns extending in a second direction perpendicular to the first direction,
wherein a width of an upper surface of each of the second dummy structures is greater than a width of an upper surface of each of the first dummy structures, and
wherein a first spacing in the first direction between central portions of neighboring second dummy structures is greater than a second spacing in the first direction between central portions of neighboring first dummy structures.

16. The vertical semiconductor device of claim 15, wherein first spacings in the second dummy region are different from each other, and wherein widths of the first spacings decrease toward the first dummy region, and the first spacing in the first direction between the central portions of the second dummy structures adjacent to the second region is the widest of the first spacings.

17. The vertical semiconductor device of claim 15, wherein a minimum distance between the neighboring second dummy structures is substantially the same as or greater than a minimum distance between the neighboring first dummy structures.

18. A vertical semiconductor device, comprising:
a conductive pattern structure disposed on a first region, wherein the first region includes a cell region, a first dummy region and a second dummy region on a substrate, the conductive pattern structure extending in a first direction;
a pad structure disposed on a second region adjacent to the first region, the pad structure contacting a side of the conductive pattern structure;

a plurality of first dummy structures extending through the conductive pattern structure on the first dummy region adjacent to the cell region; and a plurality of second dummy structures extending through the conductive pattern structure on the second dummy region adjacent to the second region, wherein the second dummy structures are disposed in a plurality of columns in a second direction perpendicular to the first direction, wherein an upper surface area of each of the second dummy structures is greater than an upper surface area of each of the first dummy structures, and wherein an area of an upper surface of each of the second dummy structures in a first column is different from an area of an upper surface of each of the second dummy structures in a second column.

19. The vertical semiconductor device of claim 18, wherein a minimum distance between the neighboring second dummy structures is substantially the same as or greater than a minimum distance between the neighboring first dummy structures.

20. The vertical semiconductor device of claim 18, wherein a first spacing in the first direction between central portions of the neighboring second dummy structures is greater than a second spacing in the first direction between central portions of the neighboring first dummy structures.

* * * * *